US009214718B2

(12) United States Patent
Mow et al.

(10) Patent No.: US 9,214,718 B2
(45) Date of Patent: Dec. 15, 2015

(54) METHODS FOR CHARACTERIZING TUNABLE RADIO-FREQUENCY ELEMENTS

(75) Inventors: Matthew A. Mow, Los Altos, CA (US); Thomas E. Biedka, San Jose, CA (US); Liang Han, Mountain View, CA (US); Rocco V. Dragone, Jr., Mountain View, CA (US); Hongfei Hu, Santa Clara, CA (US); Dean F. Darnell, San Jose, CA (US); Joshua G. Nickel, San Jose, CA (US); Robert W. Schlub, Cupertino, CA (US); Mattia Pascolini, Campbell, CA (US); Ruben Caballero, San Jose, CA (US)

(73) Assignee: Apple Inc., Cupertino, CA (US)

( * ) Notice: Subject to any disclaimer, the term of this patent is extended or adjusted under 35 U.S.C. 154(b) by 275 days.

(21) Appl. No.: 13/415,195

(22) Filed: Mar. 8, 2012

(65) Prior Publication Data

US 2013/0234741 A1     Sep. 12, 2013

(51) Int. Cl.
| | | |
|---|---|---|
| *G01R 31/02* | (2006.01) | |
| *H01Q 1/24* | (2006.01) | |
| *H01Q 9/42* | (2006.01) | |
| *H01Q 5/328* | (2015.01) | |

(Continued)

(52) U.S. Cl.
CPC .............. *H01Q 1/243* (2013.01); *H01Q 5/328* (2015.01); *H01Q 9/42* (2013.01); *H04B 17/12* (2015.01); *H04B 17/16* (2015.01); *G01R 27/32* (2013.01); *G01R 31/2822* (2013.01)

(58) Field of Classification Search
CPC .... G01R 31/02; G01R 31/001; G01R 31/002; G01R 31/31924; G01R 31/2822; G01R 23/00; G01R 23/16; G01R 23/165; G01R 23/167; G01R 23/20; H04B 17/00; H04B 17/11; H04B 17/12; H04B 17/21
USPC ............... 324/750.01, 537, 612, 76.51, 76.19
See application file for complete search history.

(56) References Cited

U.S. PATENT DOCUMENTS

| 6,055,420 A | 4/2000 | Veranth |
|---|---|---|
| 6,081,700 A | 6/2000 | Salvi et al. |

(Continued)

OTHER PUBLICATIONS

Robert S. Sorensen, U.S. Appl. No. 13/332,193, filed Dec. 20, 2011.

*Primary Examiner* — Tung X Nguyen
*Assistant Examiner* — David Frederiksen
(74) *Attorney, Agent, or Firm* — Treyz Law Group, P.C.; Jason Tsai; Joseph F. Guihan

(57) ABSTRACT

A wireless electronic device may contain at least one antenna tuning element for use in tuning the operating frequency range of the device. The antenna tuning element may include radio-frequency switches, continuously/semi-continuously adjustable components such as tunable resistors, inductors, and capacitors, and other load circuits that provide desired impedance characteristics. A test station may be used to measure the radio-frequency characteristics associated with the tuning element. The test station may provide adjustable temperature, power, and impedance control to help emulate a true application environment for the tuning element without having to place the tuning element within an actual device during testing. The test system may include at least one signal generator and a tester for measuring harmonic distortion values and may include at least two signal generators and a tester for measuring intermodulation distortion values. During testing, the antenna tuning element may be placed in a series or shunt configuration.

5 Claims, 15 Drawing Sheets

(51) Int. Cl.
  H04B 17/12 (2015.01)
  H04B 17/16 (2015.01)
  *G01R 31/28* (2006.01)
  *G01R 27/32* (2006.01)

(56) References Cited

U.S. PATENT DOCUMENTS

| | | | |
|---|---|---|---|
| 6,215,295 B1* | 4/2001 | Smith, III | 324/95 |
| 6,577,268 B1* | 6/2003 | Mustard et al. | 342/174 |
| 6,639,393 B2* | 10/2003 | Tasker | G01R 27/28 324/606 |
| 7,038,468 B2* | 5/2006 | Verspecht | 324/638 |
| 7,282,926 B1* | 10/2007 | Verspecht et al. | 324/637 |
| 7,486,067 B2* | 2/2009 | Bossche | 324/76.22 |
| 7,821,581 B2* | 10/2010 | Vorenkamp et al. | 348/726 |
| 7,885,618 B1* | 2/2011 | Karmi | 455/101 |
| 8,456,175 B2* | 6/2013 | Marchetti | G01R 27/32 324/615 |
| 8,497,689 B1* | 7/2013 | Tsironis | 324/642 |
| 2003/0058058 A1* | 3/2003 | Verspecht et al. | 333/17.3 |
| 2003/0122534 A1* | 7/2003 | Seppinen et al. | 324/76.51 |
| 2003/0124999 A1* | 7/2003 | Parssinen et al. | 455/226.1 |
| 2005/0219132 A1 | 10/2005 | Charrat | |
| 2007/0108202 A1* | 5/2007 | Kinzer | 219/772 |
| 2007/0159199 A1* | 7/2007 | Talwar et al. | 324/763 |
| 2007/0254643 A1* | 11/2007 | Garcia et al. | 455/423 |
| 2008/0020746 A1* | 1/2008 | Alexandar et al. | 455/423 |
| 2008/0055164 A1 | 3/2008 | Zhang et al. | |
| 2008/0096426 A1* | 4/2008 | Chou Huang et al. | 439/620.01 |
| 2009/0298440 A1* | 12/2009 | Takeya et al. | 455/67.14 |
| 2010/0052652 A1* | 3/2010 | Mitchell et al. | 324/76.19 |
| 2010/0123471 A1* | 5/2010 | Olgaard et al. | 324/754 |
| 2011/0299438 A1 | 12/2011 | Mikhemar et al. | |
| 2012/0007605 A1* | 1/2012 | Benedikt | G01R 27/32 324/612 |
| 2012/0009983 A1 | 1/2012 | Mow et al. | |
| 2012/0053879 A1* | 3/2012 | Chang et al. | 702/104 |
| 2012/0126821 A1* | 5/2012 | Forstner | 324/537 |
| 2012/0161784 A1* | 6/2012 | Benedikt | 324/612 |
| 2013/0093447 A1* | 4/2013 | Nickel et al. | 324/750.16 |
| 2013/0154897 A1* | 6/2013 | Sorensen et al. | 343/861 |

* cited by examiner

METHODS FOR CHARACTERIZING TUNABLE RADIO-FREQUENCY ELEMENTS

BACKGROUND

This relates generally to wireless communications circuitry, and more particularly, to electronic devices that have wireless communications circuitry.

Electronic devices such as portable computers and cellular telephones are often provided with wireless communications capabilities. For example, electronic devices may use long-range wireless communications circuitry such as cellular telephone circuitry to communicate using cellular telephone bands. Electronic devices may use short-range wireless communications circuitry such as wireless local area network communications circuitry to handle communications with nearby equipment. Electronic devices may also be provided with satellite navigation system receivers and other wireless circuitry.

To satisfy consumer demand for small form factor wireless devices, manufacturers are continually striving to implement wireless communications circuitry such as antenna components using compact structures. However, it can be difficult to fit conventional antenna structures into small devices. For example, antennas that are confined to small volumes often exhibit narrower operating bandwidths than antennas that are implemented in larger volumes. If the bandwidth of an antenna becomes too small, the antenna will not be able to cover all communications bands of interest.

In view of these considerations, it would be desirable to provide antenna tuning elements that allow the antenna to cover a wider range of frequency bands. Moreover, it may be desirable to provide ways for characterizing the performance of such types of tuning elements.

SUMMARY

A wireless electronic device may include storage and processing circuitry and wireless communications circuitry. The wireless communications circuitry may include a baseband processor, transceiver circuitry, and at least one antenna. The antenna may include an antenna resonating element and at least one antenna tuning element. The antenna tuning element may be used to help the antenna cover a wider range of communications frequencies than would otherwise be possible.

The tunable element may include radio-frequency switches, continuously or semi-continuously tunable resistive/inductive/capacitive components forming using integrated circuits, discrete surface mount components, or other suitable conductive structures, and other load circuits configured to provide desired impedance characteristics for the antenna at selected frequencies.

In accordance with an embodiment of the present invention, a test station may be provided that includes a test host, at least one signal generator for generating radio-frequency test signals, at least one tester (e.g., spectrum analyzer, vector network analyzer, etc.) for gathering radio-frequency measurements, a test fixture on which an antenna tuning element may be mounted during testing, a shielded enclosure within which the test fixture may be positioned, and other test equipment. The tuning element currently being tested at the test station may be referred to as a device under test (DUT), a device component under test, or a circuit under test (CUT).

During radio-frequency test operations, the test host may direct the signal generator(s) to generate desired radio-frequency test signals (e.g., at selected output power levels and at desired frequencies), may adjust a temperature control unit located within the shielded enclosure to modulate the operating temperature of the DUT, may adjust source/load pull tuners to present desired impedance values to the DUT at the different frequencies, and may place the DUT in different modes of operation. During testing, for example, the test host may switch certain portions of the DUT into use and other portions of the DUT out of use (e.g., some radio-frequency switches may be turned on while other radio-frequency switches may be turned off). As another example, the test host may adjust the antenna tuning circuit to exhibit desired capacitance values.

The test station may be configured to emulate a true application environment for the DUT so that the DUT can be tested in a well-controlled system without actually having to assemble the DUT within a form factor electronic device. The DUT may be tested while it is placed in a series configuration or while it is placed in a shunt configuration. In the series configuration, both of the two terminals of the antenna tuning element may be coupled to adjustable source/load pull tuners and other test equipment. In the shunt configuration, a first of the two terminals of the antenna of antenna tuning element may be coupled to ground while a second of the two terminals may be coupled to adjustable load pull tuners, signal generators, spectrum analyzers, and other test equipment.

A test station configured in this way may be used to obtain linear and non-linear measurements on an antenna tuning element. The test station may obtain linear measurements such as S-parameters and frequency response related measurements. The test station may also obtain non-linear measurements such as harmonic distortion measurements and intermodulation distortion measurements. Characterization of harmonic distortion may require only one signal generator, whereas characterization of harmonic distortion may require at least two signal generators. Testers such as spectrum analyzers may be optionally coupled to non-grounded terminal(s) of an antenna tuning element via broadband radio-frequency couplers.

The test host may then be used to determine whether an antenna tuning element currently being tested satisfies design criteria (and should therefore be marked as a passing part) or whether the antenna tuning element currently being tested fails to satisfy design criteria (and should therefore be marked as a failing part) by comparing measured/computed harmonic and intermodulation distortion values to predetermined threshold values.

Further features of the present invention, its nature and various advantages will be more apparent from the accompanying drawings and the following detailed description.

DETAILED DESCRIPTION

Figure 1:
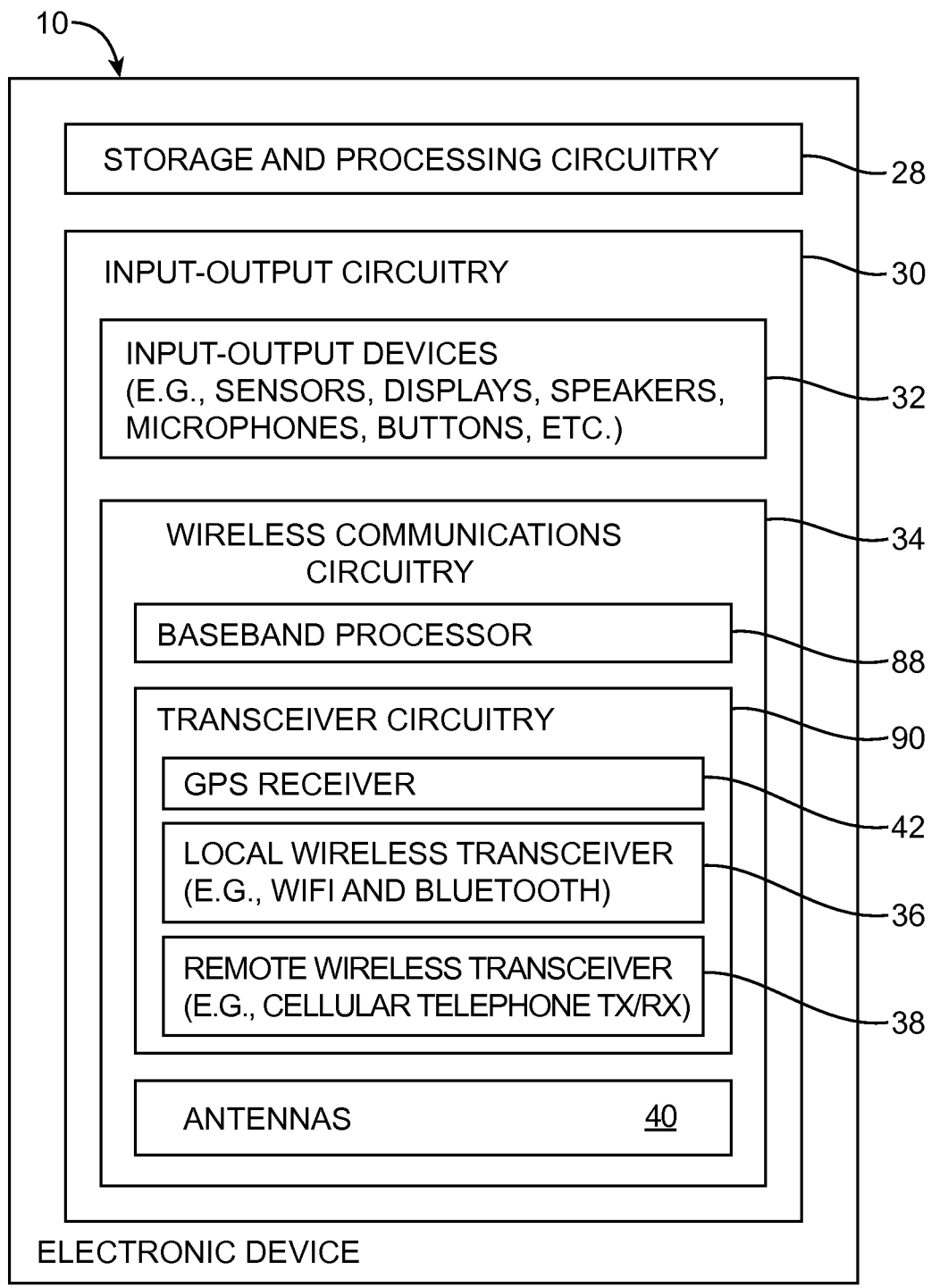
FIG. 1 is a schematic diagram of an illustrative electronic device with wireless communications circuitry in accordance with an embodiment of the present invention.

Electronic devices such as device 10 of FIG. 1 may be provided with wireless communications circuitry. The wireless communications circuitry may be used to support long-range wireless communications such as communications in cellular telephone bands. Examples of long-range (cellular telephone) bands that may be handled by device 10 include the 800 MHz band, the 850 MHz band, the 900 MHz band, the 1800 MHz band, the 1900 MHz band, the 2100 MHz band, the 700 MHz band, and other bands. The long-range bands used by device 10 may include the so-called LTE (Long Term Evolution) bands. The LTE bands are numbered (e.g., 1, 2, 3, etc.) and are sometimes referred to as E-UTRA operating bands. Long-range signals such as signals associated with satellite navigation bands may be received by the wireless communications circuitry of device 10. For example, device 10 may use wireless circuitry to receive signals in the 1575 MHz band associated with Global Positioning System (GPS) communications. Short-range wireless communications may also be supported by the wireless circuitry of device 10. For example, device 10 may include wireless circuitry for handling local area network links such as WiFi® links at 2.4 GHz and 5 GHz, Bluetooth® links at 2.4 GHz, etc.

As shown in FIG. 1, device 10 may include storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VoIP) telephone call applications, email applications, media playback applications, operating system functions, functions related to communications band selection during radio-frequency transmission and reception operations, etc. To support interactions with external equipment such as base station 21, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, IEEE 802.16 (WiMax) protocols, cellular telephone protocols such as the "2G" Global System for Mobile Communications (GSM) protocol, the "2G" Code Division Multiple Access (CDMA) protocol, the "3G" Universal Mobile Telecommunications System (UMTS) protocol, and the "4G" Long Term Evolution (LTE) protocol, MIMO (multiple input multiple output) protocols, antenna diversity protocols, etc. Wireless communications operations such as communications band selection operations may be controlled using software stored and running on device 10 (i.e., stored and running on storage and processing circuitry 28 and/or input-output circuitry 30).

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, click wheels, scrolling wheels, touch pads, key pads, keyboards, microphones, cameras, buttons, speakers, status indicators, light sources, audio jacks and other audio port components, digital data port devices, light sensors, motion sensors (accelerometers), capacitance sensors, proximity sensors, etc.

Input-output circuitry 30 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 90 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as at 850 MHz, 900 MHz, 1800 MHz, 1900 MHz, and 2100 MHz and/or the LTE bands and other bands (as examples). Circuitry 38 may handle voice data and non-voice data traffic.

Transceiver circuitry 90 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include one or more antennas 40. Antennas 40 may be formed using any suitable antenna types. For example, antennas 40 may include antennas with resonating elements that are formed from loop antenna structure, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna.

As shown in FIG. 1, wireless communications circuitry 34 may also include baseband processor 88. Baseband processor may include memory and processing circuits and may also be considered to form part of storage and processing circuitry 28 of device 10.

Baseband processor 88 may be used to provide data to storage and processing circuitry 28. Data that is conveyed to circuitry 28 from baseband processor 88 may include raw and processed data associated with wireless (antenna) performance metrics for received signals such as received power, transmitted power, frame error rate, bit error rate, channel quality measurements based on received signal strength indicator (RSSI) information, channel quality measurements based on received signal code power (RSCP) information, channel quality measurements based on reference symbol received power (RSRP) information, channel quality measurements based on signal-to-interference ratio (SINR) and signal-to-noise ratio (SNR) information, channel quality measurements based on signal quality data such as Ec/Io or Ec/No data, information on whether responses (acknowledgements) are being received from a cellular telephone tower corresponding to requests from the electronic device, information on whether a network access procedure has succeeded, information on how many re-transmissions are being requested over a cellular link between the electronic device and a cellular tower, information on whether a loss of signaling message has been received, information on whether paging signals have been successfully received, and other information that is reflective of the performance of wireless circuitry 34. This information may be analyzed by storage and processing circuitry 28 and/or processor 88 and, in response, storage and processing circuitry 28 (or, if desired, baseband processor 58) may issue control commands for controlling wireless circuitry 34. For example, baseband processor 88 may issue commands that direct transceiver circuitry 90 to switch into use desired transmitters/receivers and antennas.

Antenna diversity schemes may be implemented in which multiple redundant antennas are used in handling communications for a particular band or bands of interest. In an antenna diversity scheme, storage and processing circuitry 28 may select which antenna to use in real time based on signal strength measurements or other data. In multiple-input-multiple-output (MIMO) schemes, multiple antennas may be used in transmitting and receiving multiple data streams, thereby enhancing data throughput.

Figure 2:
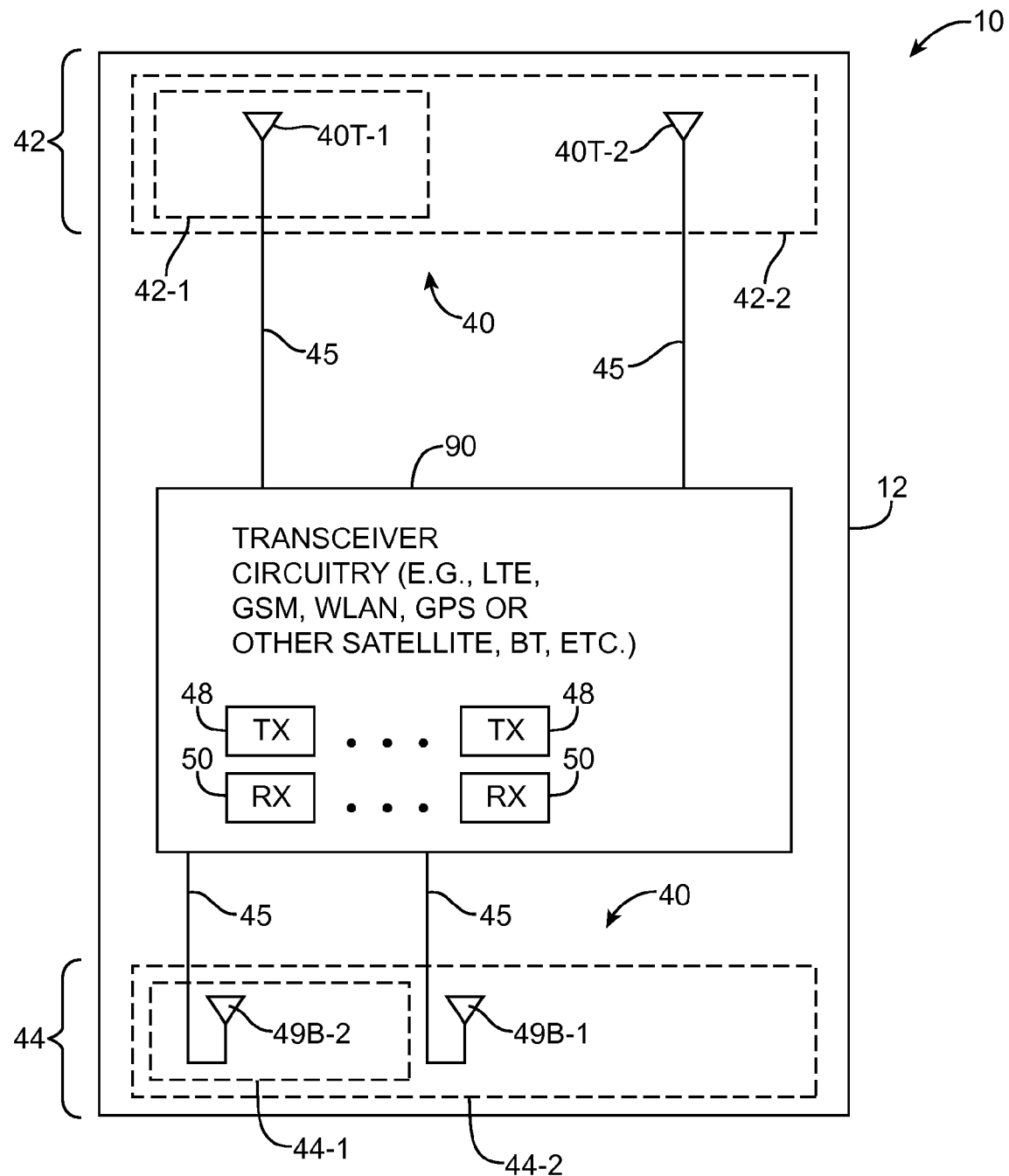
FIG. 2 is a diagram showing how radio-frequency transceiver circuitry may be coupled to one or more antennas within an electronic device of the type shown in FIG. 1 in accordance with an embodiment of the present invention.

Illustrative locations in which antennas 40 may be formed in device 10 are shown in FIG. 2. As shown in FIG. 2, electronic device 10 may have a housing such as housing 12. Housing 12 may include plastic walls, metal housing structures, structures formed from carbon-fiber materials or other composites, glass, ceramics, or other suitable materials. Housing 12 may be formed using a single piece of material (e.g., using a unibody configuration) or may be formed from a frame, housing walls, and other individual parts that are assembled to form a completed housing structure. The components of device 10 that are shown in FIG. 1 may be mounted within housing 12. Antenna structures 40 may be mounted within housing 12 and may, if desired, be formed using parts of housing 12. For example, housing 12 may include metal housing sidewalls, peripheral conductive members such as band-shaped members (with or without dielectric gaps), conductive bezels, and other conductive structures that may be used in forming antenna structures 40.

As shown in FIG. 2, antenna structures 40 may be coupled to transceiver circuitry 90 by paths such as paths 45. Paths 45 may include transmission line structures such as coaxial cables, microstrip transmission lines, stripline transmission lines, etc. Impedance matching circuitry, filter circuitry, and switching circuitry may be interposed in paths 45 (as examples). Impedance matching circuitry may be used to ensure that antennas 40 are efficiently coupled to transceiver circuitry 90 in desired frequency bands of interest. Filter circuitry may be used to implement frequency-based multiplexing circuits such as diplexers, duplexers, and triplexers. Switching circuitry may be used to selectively couple antennas 40 to desired ports of transceiver circuitry 90. For example, a switch may be configured to route one of paths 45 to a given antenna in one operating mode. In another operating mode, the switch may be configured to route a different one of paths 45 to the given antenna. The use of switching circuitry between transceiver circuitry 90 and antennas 40 allows device 10 to switch particular antennas 40 in and out of use depending on the current performance associated with each of the antennas.

In a device such as a cellular telephone that has an elongated rectangular outline, it may be desirable to place antennas 40 at one or both ends of the device. As shown in FIG. 2, for example, some of antennas 40 may be placed in upper end region 42 of housing 12 and some of antennas 40 may be placed in lower end region 44 of housing 12. The antenna structures in device 10 may include a single antenna in region 42, a single antenna in region 44, multiple antennas in region 42, multiple antennas in region 44, or may include one or more antennas located elsewhere in housing 12.

Antenna structures 40 may be formed within some or all of regions such as regions 42 and 44. For example, an antenna such as antenna 40T-1 may be located within region 42-1 or an antenna such as antenna 40T-2 may be formed that fills some or all of region 42-2. Similarly, an antenna such as antenna 40B-1 may fill some or all of region 44-2 or an antenna such as antenna 40B-2 may be formed in region 44-1. These types of arrangements need not be mutually exclusive.

For example, region 44 may contain a first antenna such as antenna 40B-1 and a second antenna such as antenna 40B-2.

Transceiver circuitry 90 may contain transmitters such as radio-frequency transmitters 48 and receivers such as radio-frequency receivers 50. Transmitters 48 and receivers 50 may be implemented using one or more integrated circuits (e.g., cellular telephone communications circuits, wireless local area network communications circuits, circuits for Bluetooth® communications, circuits for receiving satellite navigation system signals, power amplifier circuits for increasing transmitted signal power, low noise amplifier circuits for increasing signal power in received signals, other suitable wireless communications circuits, and combinations of these circuits).

Figure 3:
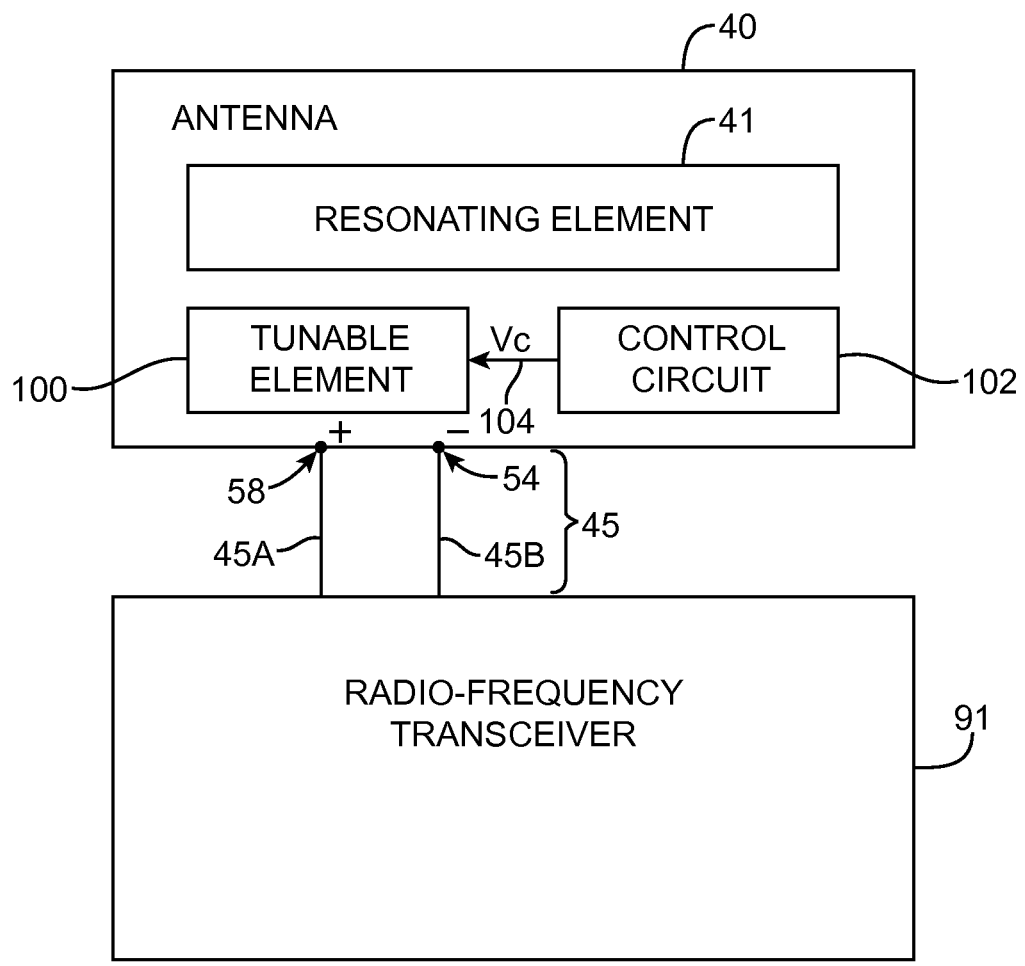
FIG. 3 is a circuit diagram showing how an antenna in the electronic device of FIG. 1 may be coupled to radio-frequency transceiver circuitry in accordance with an embodiment of the present invention.

FIG. 3 is a diagram showing how radio-frequency path 45 may be used to convey radio-frequency signals between an antenna 40 and radio-frequency transceiver 91. Antenna 40 may be one of the antennas of FIG. 2 (e.g., antenna, 40T-1, 40T-2, 40B-1, 40B-2, or other antennas). Radio-frequency transceiver 91 may include receivers and/or transmitters in transceiver circuitry 90, wireless local area network transceiver 36 (e.g., a transceiver operating at 2.4 GHz, 5 GHz, 60 GHz, or other suitable frequency), cellular telephone transceiver 38, or other radio-frequency transceiver circuitry for receiving and/or transmitting radio-frequency signals.

Conductive path 45 may include one or more transmission lines such as one or more segments of coaxial cable, one or more segments of microstrip transmission line, one or more segments of stripline transmission line, or other transmission line structures. Path 45 may include a first conductor such as signal line 45A and may include a second conductor such as ground line 45B. Antenna 40 may have an antenna feed with a positive antenna feed terminal (+) that is coupled to signal path 45A and a ground antenna feed terminal 54 (−) that is coupled to ground path 45B. If desired, circuitry such as filters, impedance matching circuits, switches, amplifiers, and other radio-frequency circuits may be interposed within path 45.

As shown in FIG. 3, antenna 40 may include a resonating element 41 and antenna tuning circuitry. Resonating element 41 may be formed from a loop antenna structure, patch antenna structure, inverted-F antenna structure, slot antenna structures, planar inverted-F antenna structures, helical antenna structures, hybrids of these designs, etc. The use of antenna tuning circuitry may help device 10 cover a wider range of communications frequencies than would otherwise be possible.

In general, it is desirable for device 10 to be able to exhibit wide band coverage (e.g., for device 10 to be able to support operation in multiple frequency bands corresponding to different radio access technologies). For example, it may be desirable for antenna 40 to be capable of operating in a higher frequency band that covers the GSM sub-bands at 1800 MHz and 1900 MHz and the data sub-band at 2100 MHz, a first lower frequency band that covers the GSM sub-bands at 850 MHz and 900 MHz, and a second lower frequency band that covers the LTE band at 700 MHz, the GSM sub-bands at 710 MHz and 750 MHz, the UMTS sub-band at 700 MHz, and other desired wireless communications bands.

The band coverage of antenna 40 may be limited by its volume (i.e., the amount of space that is occupied by antenna 40 within housing 12). For an antenna having a given volume, a higher band coverage (or bandwidth) results in a decrease in gain (e.g., the product of maximum gain and bandwidth is constant). As a result, increasing the volume of antenna 40 will generally increase its band coverage. Increasing the volume of antennas, however, may not always be feasible if a small form factor is desired.

To satisfy consumer demand for small form factor wireless devices, one or more of antennas 40 may be provided with antenna tuning circuitry. The antenna tuning circuitry may include a radio-frequency tunable component such as tunable component (sometimes referred to as an adjustable antenna tuning element) 100 and an associated control circuitry such as control circuit 102 (see, e.g., FIG. 3). Tunable element 100 and/or control circuit 102 may sometimes be formed as an integral part of antenna resonating element 41 or as a separate discrete surface-mount component that is attached to antenna resonating element 41.

For example, antenna tuning element 100 may include switching circuitry based on one or more switches or continuously tunable load components. Control circuit 102 may be used to place tunable element 100 in the desired state by sending appropriate control signals Vc via path 104. The switching circuitry may, for example, include a switch that can be placed in an open or closed position. When the switch is placed in its open position (e.g., when control signal Vc has a first value), antenna 40 may exhibit a first frequency response. When the switch is placed in its closed position (e.g., when control signal Vc has a second value that is different than the first value), antenna 40 may exhibit a second frequency response. By using an antenna tuning scheme of this type, a relatively narrow bandwidth (and potentially compact) design can be used for antenna 40, if desired.

Figure 4A:
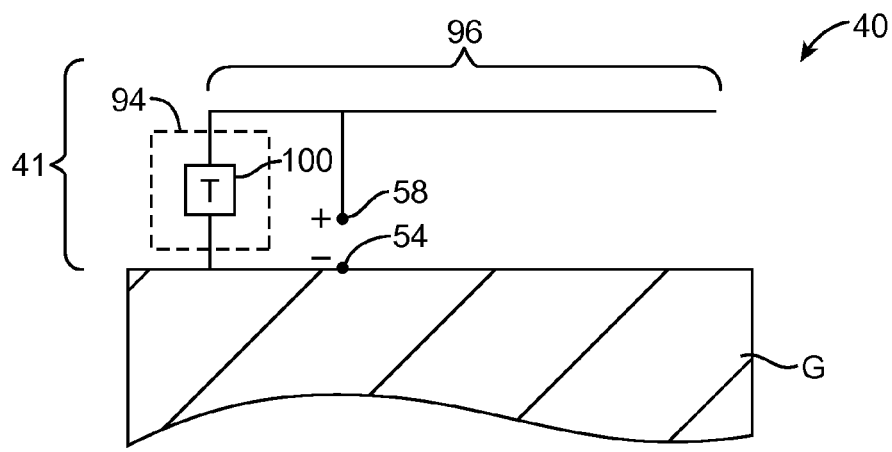
FIGS. 4A, 4B, and 4C are schematic diagrams of an illustrative inverted-F antenna containing antenna tuning elements in accordance with an embodiment of the present invention.

In one suitable embodiment of the present invention, antenna 40 may be an inverted-F antenna. FIG. 4A is a schematic diagram of an inverted-F antenna that may be used in device 10. As shown in FIG. 4A, inverted-F antenna 40 may have an antenna resonating element such as antenna resonating element 41 and a ground structure such as ground G. Antenna resonating element 41 may have a main resonating element arm such as arm 96. Short circuit branch such as shorting path 94 may couple arm 96 to ground G. An antenna feed may contain positive antenna feed terminal 58 (+) and ground antenna feed terminal 54 (−). Positive antenna feed terminal 58 may be coupled to arm 96, whereas ground antenna feed terminal 54 may be coupled to ground G. Arm 96 in the FIG. 4A example is shown as being a single straight segment. This is merely illustrative. Arm 96 may have multiple bends with curved and/or straight segments, if desired.

In the example of FIG. 4A, inverted-F antenna 40 may include an antenna tuning element 100 interposed in shorting path 94. Antenna tuning element 100 may, for example, be a switchable impedance matching network, a switchable inductive network, a continuously tunable capacitive circuit, etc.

Figure 4B:
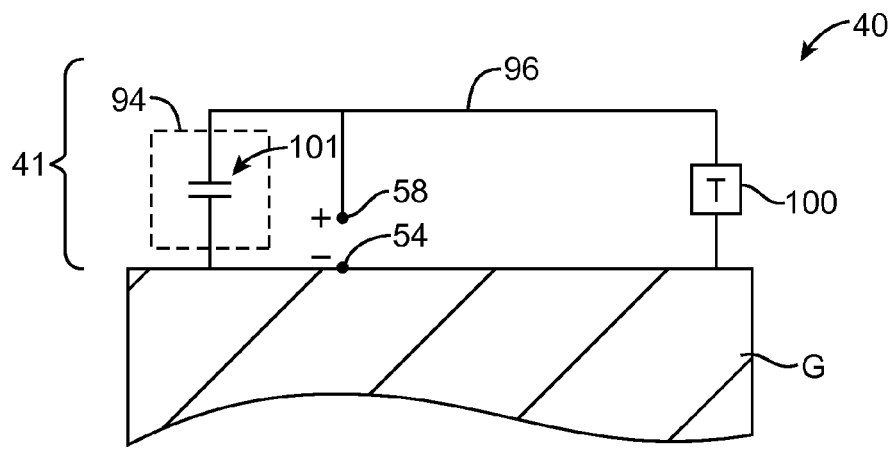

In another suitable arrangement of the present invention, resonating element 41 of inverted-F antenna 40 may include an antenna tuning element 100 coupled between the extended portion of resonating arm 96 and ground G (see, e.g., FIG. 4B). In such an arrangement, a capacitive structure such as capacitor 101 may be interposed in shorting path 94 so that antenna tuning circuit 100 is not shorted to ground at low frequencies. In the example of FIG. 4B, antenna tuning element 100 may be a switchable inductor, a continuously tunable capacitive/resistive circuit, etc.

Figure 4C:
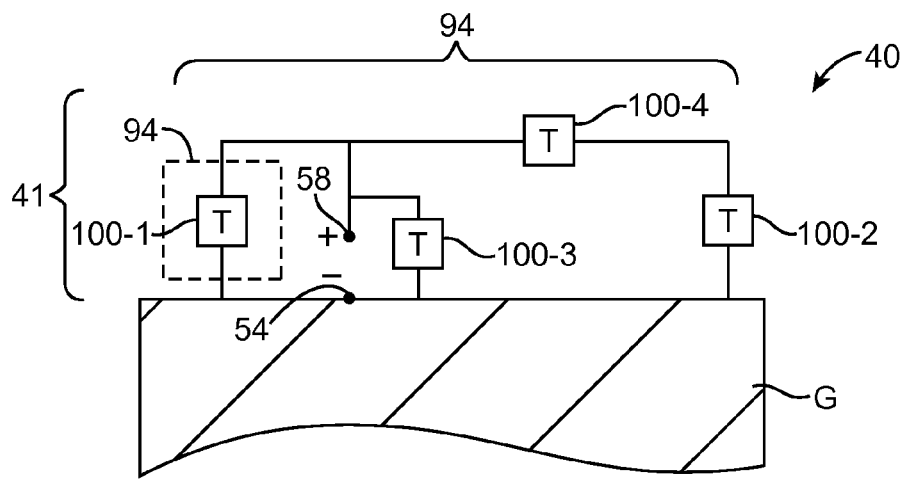

In general, antenna 40 may include any number of antenna tuning elements 100. As shown in FIG. 4C, short circuit branch 94 may include at least one tunable element 100-1 that couples arm 96 to ground. Tunable element 100-1 may be a switchable inductive path, as an example (e.g., element 100-1 may be activated to short arm 96 to ground). If desired, antenna tuning element 100-3 may be coupled in parallel with the antenna feed between positive antenna feed terminal 58 and ground feed terminal 54. Tunable element 100-3 may be an adjustable impedance matching network circuit, as an example.

As another example, antenna tuning element 100-4 may be interposed in antenna resonating arm 96. Antenna tuning element 100-4 may be a continuously adjustable variable capacitor (as an example). If desired, additional tuning elements such tuning element 100-2 (e.g., continuously tunable or semi-continuously tunable capacitors, switchable inductors, etc.) may be coupled between the extended portion of arm 96 to ground G.

The placement of these tuning circuits 100 in FIGS. 4A, 4B, and 4C is merely illustrative and do not serve to limit the scope of the present invention. Additional capacitors and/or inductors may be added to ensure that each antenna tuning circuit 100 is not shorted circuited to ground at low frequencies (e.g., frequencies below 100 MHz). In general, antennas 40 in device 10 may include antennas with resonating elements that are formed from loop antenna structures, patch antenna structures, inverted-F antenna structures, slot antenna structures, planar inverted-F antenna structures, helical antenna structures, hybrids of these designs, etc. At least a portion of antennas 40 in device 10 may contain at least one antenna tuning element 100 (formed at any suitable location on the antenna) that can be adjusted so that wireless circuitry 34 may be able to cover the desired range of communications frequencies.

Figure 5A:
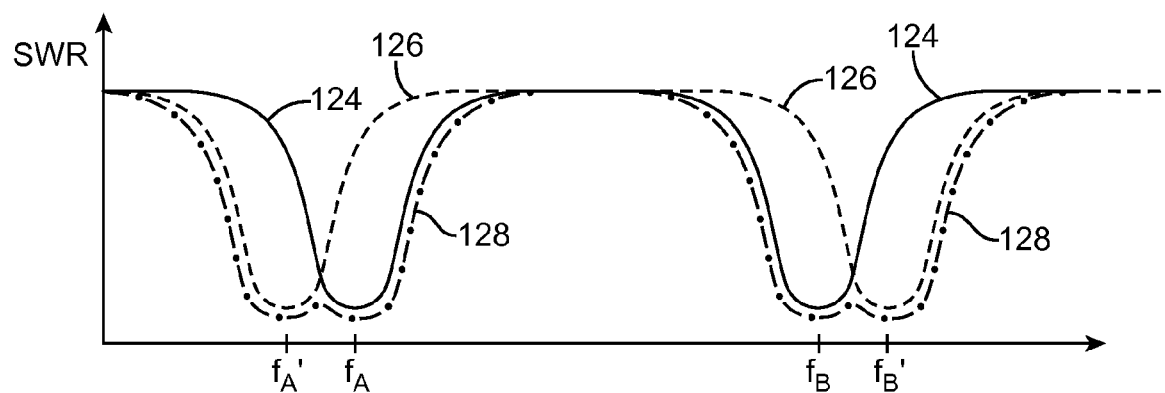
FIGS. 5A and 5B are plots showing how antennas containing tuning elements may be used to cover multiple communications bands of interest in accordance with an embodiment of the present invention.

By dynamically controlling antenna tuning elements 100, antenna 40 may be able to cover a wider range of radio-frequency communications frequencies than would otherwise be possible. A standing-wave-ratio (SWR) versus frequency plot such as SWR plot of FIG. 5A illustrates the band tuning capability for antenna 40. As shown in FIG. 5A, solid SWR frequency characteristic curve 124 corresponds to a first antenna tuning mode in which antenna 40 exhibits satisfactory resonant peaks at low-band frequency $f_A$ (e.g., to cover the 850 MHz band) and high-band frequency $f_B$ (e.g., to cover the 1900 MHz band). In the first antenna tuning mode, the antenna tuning elements 100 of antenna 40 may be placed in a first configuration (e.g., antenna tuning elements 100 may be provided with a first set of control signals).

Dotted SWR frequency characteristic curve 126 corresponds to a second antenna tuning mode in which the antennas of device 10 exhibits satisfactory resonant peaks at low-band frequency $f_A'$ (e.g., to cover the 750 MHz band) and high-band frequency $f_B'$ (e.g., to cover the 2100 MHz band). In the second antenna tuning mode, the antenna tuning elements 100 may be placed in a second configuration that is different than the first configuration (e.g., antenna tuning circuits 100 may be provided with a second set of control signals that is different than the first set of control signals).

If desired, antenna 40 may be placed in a third antenna tuning mode in which antenna 40 exhibits satisfactory resonant peaks at both low-band frequencies $f_A'$ and $f_A$ (e.g., to cover both the 750 and 850 MHz bands) and at high-band frequencies $f_B$ and $f_B'$ (e.g., to cover both the 1900 and 2100 MHz bands), as shown by SWR characteristic curve 128. In the third antenna tuning mode, the antenna tuning elements 100 may be placed in a third configuration that is different than the first and second configurations (e.g., antenna tuning elements 100 may be provided with a third set of control signals that is different than the first and second sets of control signals). A combination of tuning methods may be used so that the resonance curve 128 exhibits broader frequency ranges than curves 124 and 126.

Figure 5B:
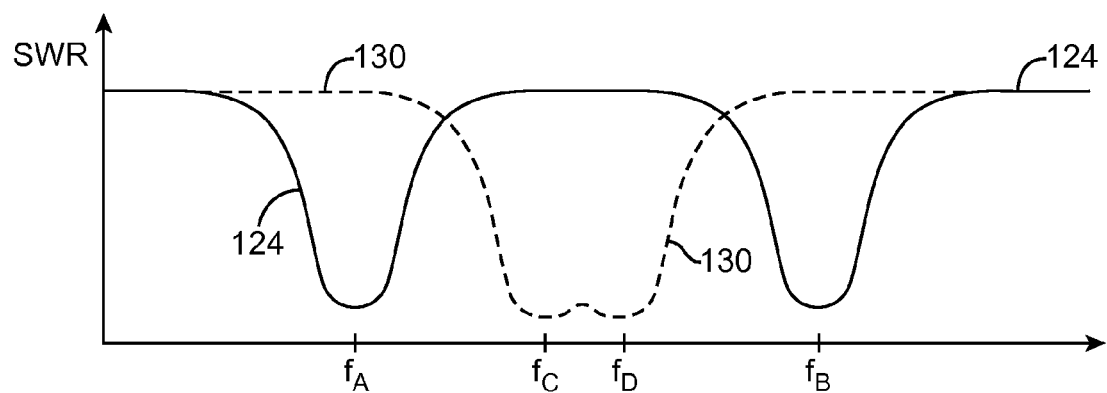

In another suitable arrangement, antenna 40 may be placed in a fourth antenna tuning mode in which antenna 40 exhibits satisfactory resonant peaks at mid-band frequencies $f_c$ and $f_D$ (e.g., to cover frequencies between the low and high bands), as shown by SWR characteristic curve 130 of FIG. 5B. In the fourth antenna tuning mode, the antenna tuning circuits 100 may yet be placed in another different configuration. The SWR curves of FIGS. 5A and 5B are merely illustrative and do not serve to limit the scope of the present invention. In general, antenna(s) 40 may include antenna tuning circuits 100 that enable device 10 to transmit and receive wireless signals in any suitable number of radio-frequency communications bands.

Figure 6A:
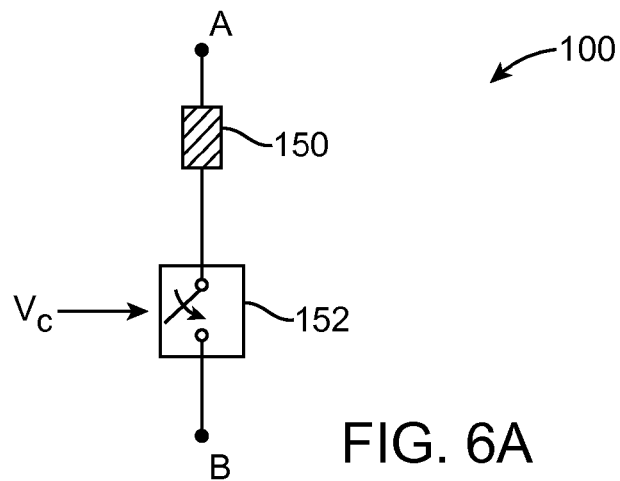
FIGS. 6A and 6B are circuit diagrams of illustrative switchable load circuits that may be used as antenna tuning elements in accordance with an embodiment of the present invention.

Antenna tuning element 100 may be any switchable or tunable electrical component that can be adjusted in real time. Antenna tuning element 100 may have a first terminal A and a second terminal B that may be coupled to desired locations on antenna resonating element 41 and a third terminal operable to receive control signal Vc from control circuit 102. FIG. 6A shows one suitable circuit implementation of tunable element 100. As shown in FIG. 6A, element 100 may include a radio-frequency switch 150 and a load circuit 152 coupled in series between terminals A and B. Switch 152 may be implemented using a p-i-n diode, a gallium arsenide field-effect transistor (FET), a microelectromechanical systems (MEMS) switch, a metal-oxide-semiconductor field-effect transistor (MOSFET), a high-electron mobility transistor (HEMT), a pseudomorphic HEMT (PHEMT), a transistor formed on a silicon-on-insulator (SOI) substrate, etc. The state of the switch can be controlled using signal Vc generated from control circuit 102 (see, e.g., FIG. 3). For example, a high Vc will turn on or close switch 402 whereas a low Vc will turn off or open switch 402.

Load circuit 152 may be formed from one or more electrical components. Components that may be used as all or part of circuit 152 include resistors, inductors, and capacitors. Desired resistances, inductances, and capacitances for circuit 152 may be formed using integrated circuits, using discrete components (e.g., a surface mount technology inductor) and/or using dielectric and conductive structures that are not part of a discrete component or an integrated circuit. For example, a resistance can be formed using thin lines of a resistive metal alloy, capacitance can be formed by spacing two conductive pads close to each other that are separated by a dielectric, and an inductance can be formed by creating a conductive path (e.g., a transmission line) on a printed circuit board.

Figure 6B:
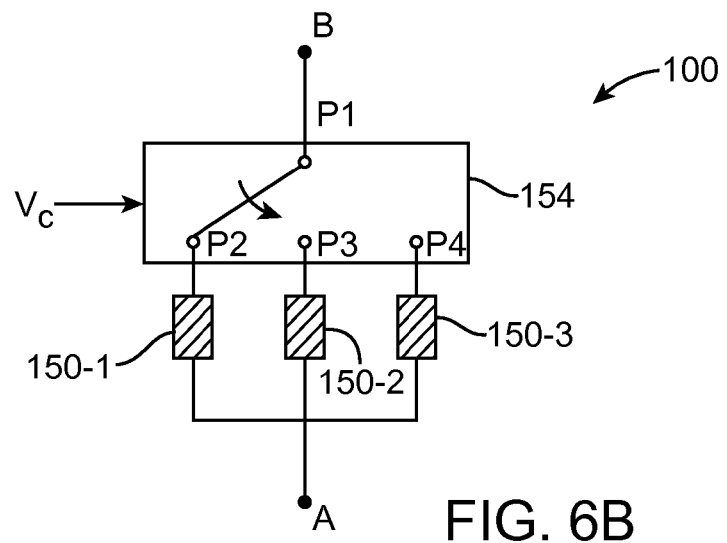

In another suitable arrangement, tunable element 100 may include a switch 154 (e.g., a single-pole triple-throw radio-frequency switch) and multiple load circuits 150-1, 150-2, and 150-3. As shown in FIG. 6B, switch 154 may have ports P1, P2, P3, and P4. Terminal B of tunable element 100 may be coupled to port P1 while terminal A of tunable element 100 may be coupled to port P2 via circuit 150-1, to port P3 via circuit 150-2, and to port P4 via circuit 150-3. As described previously, load circuits 150-1, 150-2, and 150-3 may include any desired combination of resistive components, inductive components, and capacitive components formed using integrated circuits, discrete components, or other suitable conductive structures. Switch 154 may be controlled using signal Vc generated by control circuit 102. For example, switch 154 may be configured to couple port P1 to P2 when Vc is at a first value, to couple port P1 to P3 when Vc is at a second value that is different than the first value, and to couple port P1 to P4 when Vc is at a third value that is different than the first and second values.

The example of FIG. 6B in which tunable element 100 includes three impedance loading circuits is merely illustrative and does not serve to limit the scope of the present invention. If desired, tunable element 100 may include a radio-frequency switch having any number of ports configured to support switching among any desired number of loading circuits. If desired, switch 154 may be configured such that more than one of the multiple loading circuits 150 may be coupled to port P1 in parallel.

Figure 6C:
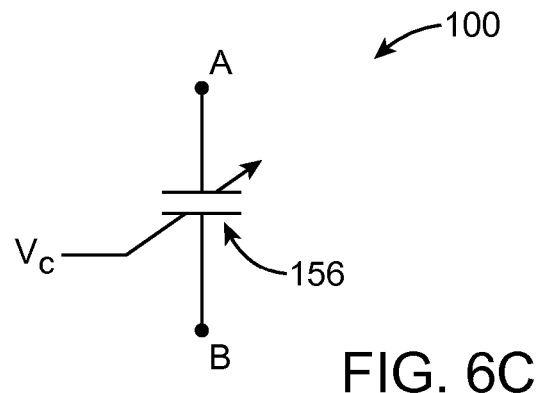
FIG. 6C is a circuit diagram of an illustrative variable capacitor circuit that may be used as an antenna tuning element in accordance with an embodiment of the present invention.

In another suitable arrangement, tunable element 100 may include a variable capacitor circuit 156 (sometimes referred to as a varactor). As shown in FIG. 6C, varactor may have first terminal A, second terminal B, and a control terminal operable to receive signal Vc from control circuit 300. Control circuit 102 may be adjusted so that Vc adjusts the capacitance of varactor 156 to the desired amount. Varactor 156 may be formed using integrated circuits, one or more discrete components (e.g., SMT components), etc. In general, varactor 156 may be continuously variable capacitors or semi-continuously adjustable capacitors.

It may be desirable to have a way of characterizing the performance of antenna tuning element 100 to determine its behavior when assembled within device 10. One way of testing the performance of antenna tuning element 100 involves mounting antenna tuning element 100 within an actual device 10 so that antenna tuning element 100 is placed in its true application environment (e.g., antenna tuning element 100 is placed in its intended assembled state, enabling element 100 to be presented with actual loading and operating conditions).

Figure 7:
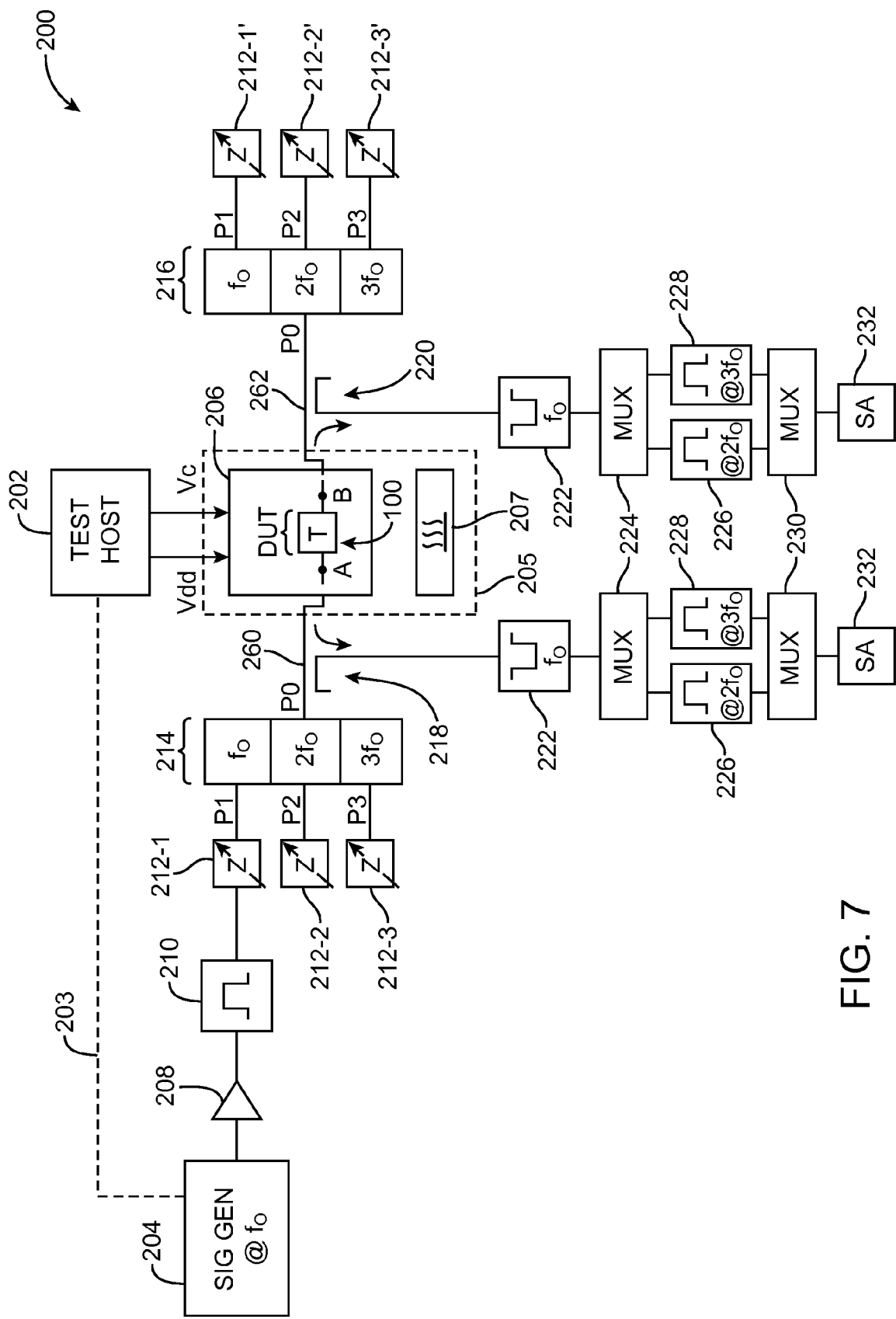
FIG. 7 is a diagram of a test system for characterizing harmonic distortion for an antenna tuning element arranged in a series configuration in accordance with an embodiment of the present invention.

Another way of testing the performance of antenna tuning element 100 is via the use of a test system such as test system 200 that is configured to emulate the true application environment that antenna tuning element 100 would experience if assembled within an actual device 10 (see, e.g., FIG. 7). Test system (sometimes referred to as a test station) 200 may be used to provide a well-controlled automated test environment for use in providing measurement repeatability, because multiple antenna tuning elements 100 may be sequentially characterized during manufacturing processes without having to be assembled/mounted within an actual device 10. Testing device structures in this way may help increase production efficiency by minimizing the probability that a defective antenna tuning element or other device structure(s) is assembled within device 10.

As shown in FIG. 7, antenna tuning element 100 may be placed in a test fixture such as test fixture 206. A device structure such as an antenna tuning element 100 that is being tested may be referred to as a device under test (DUT). Test fixture 206 may be a socket-based fixture, a rigid printed circuit board (PCB) based fixture, a flexible printed circuit board (sometimes referred to as a "flex circuit") based fixture, a rigid-flex circuit based fixture, or other suitable substrate on which antenna tuning element can be easily mounted and removed during test operations.

During testing, DUT 100 may be optionally placed within a test enclosure such as test enclosure 205 (while it is mounted to test fixture 206). Test enclosure 205 may be a shielded enclosure (e.g., a shielded test box) that can be used to provide radio-frequency isolation when performing electromagnetic compatibility (EMC) radiated tests without experiencing interference from outside environment. Test enclosure 205 may, for example, be a transverse electromagnetic (TEM) cell. The interior of test enclosure 205 may be lined with radio-frequency absorption material such as rubberized foam configured to minimize reflections of wireless signals.

A temperature control unit such as temperature control unit 207 may be placed within test enclosure 206 for modulating the operating temperature of DUT 100 during testing. Temperature control unit 207 may be controlled using a test host such as test host 202. Test host 202 may, for example, be a personal computer or other types of computing equipment. Test host 202 may also be used to control the voltage level of power supply voltage Vdd that is supplied to DUT 100 and to control signal Vc for adjusting the state of DUT 100 (e.g., to control signal Vc for tuning antenna tuning element 100 under test).

When DUT 100 is mounted to test fixture 206, terminal A of element 100 may make electrical contact with a first conductive terminal on fixture 206 while terminal B of element 100 may make electrical contact with a second conductive terminal on fixture 206. The first and second terminals of fixture 206 may each be coupled to other test equipment (e.g., signal generators, spectrum analyzers, vector network analyzers, etc.). DUT 100 arranged in this way (i.e., where neither of terminals A and B are coupled to ground) may be referred to as being coupled in a series configuration.

The first terminal of fixture 206 may be coupled to signal path 260, whereas the second terminal of fixture 206 may be coupled to signal path 262. Path 262 may be coupled to three load pull tuners (e.g., a component that can be used to adjust the impedance as seen by the DUT) via a triplexer 216. The load pull tuners may be controlled individually using test host 202 to provide desired impedance characteristics (e.g., the load pull tuners may be used to emulate complex impedance characteristics ranging from an open circuit to a short circuit). Triplexer 216 may be a passive component for implementing frequency domain multiplexing. Triplexer 216 may have three ports P1, P2, and P3 that are multiplexed onto a fourth port P0. The signals on ports P1-P3 may occupy different frequency bands while signals on ports P1-P3 may coexist on port P0 without interfering with one another.

In the example of FIG. 7, port P0 of triplexer 216 is coupled to path 262, port P1 of triplexer 216 may be coupled to first load pull tuner 212-1' (e.g., a tuner for adjusting the impedance as seen by DUT 100 from terminal B for RF signals transmitted at fundamental frequency $f_0$), port P2 of triplexer 216 may be coupled to second load pull tuner 212-2' (e.g., a tuner for adjusting the impedance as seen by DUT 100 from terminal B for RF signals transmitted at second harmonic frequency $2*f_0$), and port P3 of triplexer 216 may be coupled to third load pull tuner 212-3' (e.g., a tuner for adjusting the impedance as seen by DUT 100 from terminal B for RF signals transmitted at third harmonic frequency $3*f_0$). The selective impedance tuning at the different harmonic frequencies is provided using the frequency domain multiplexing capability of triplexer 216.

At the other end, path 260 may be coupled to a triplexer such as triplexer 214. In particular, triplexer 214 may include port P0 that is coupled to path 260, port P1 that is coupled to a tester such as signal generator 204 via associated load pull tuner 212-1, port P2 that is coupled to corresponding load pull tuner 212-2, and port P3 that is coupled to corresponding load pull tuner 212-3. Load pull tuners 212-1, 212-2, and 212-3 may be used to adjust the impedance as seen by DUT 100 from terminal A at selective frequencies $f_0$, $2f_0$, and $3f_0$ (as an example).

Amplifying circuitry such as power amplifier circuit 208 and filter circuit 210 may be interposed between signal generator 204 and load pull tuner 212-1. Amplifier 208 may be used to amplify radio-frequency test signals that are generated from tester 204. Filter 210 may be used to provide low-pass or band-pass filtering for passing signals near fundamental frequency $f_0$ (i.e., signals relatively far from $f_0$ will be attenuated by filter 210).

Signal generator 204 may be used for generating radio-frequency test signals at desired fundamental frequencies $f_0$.

These test signals may be provided to DUT 100 via path a coaxial cable, radio-frequency transmission line, or other suitable conductive paths. If desired, signal generator 204 may be a radio communications tester of the type that is sometimes referred to as a call box or a base station emulator. Signal generator 204 may, for example, be the CMU200 Universal Radio Communication Tester available from Rohde & Schwarz.

Signal generator 204 may be operated directly or via computer control (e.g., when signal generator 204 receives commands from test host 202 via path 203). When operated directly, a user may control signal generator 204 by supplying commands directly to the signal generator using a user input interface of signal generator 204. For example, a user may press buttons in a control panel on the signal generator while viewing information that is displayed on a display in generator 204. In computer controlled configurations, test host 202 (e.g., software running autonomously or semi-autonomously on the computer) may communicate with signal generator 204 (e.g., by sending and receiving data over a wired path 203 or a wireless path between the computer and the signal generator).

Radio-frequency measurement equipment may be coupled to at least one of paths 260 and 262. Radio-frequency measurement equipment may be a spectrum analyzer such as spectrum analyzer (SA) 232, vector network analyzer (VNA), or other radio-frequency testers. Results gathered using tester 232 may be retrieved by test host 202 for further processing.

Spectrum analyzer 232 may include radio-frequency receiver circuitry that is able to gather information on the magnitude of signals reflected from DUT 100 (i.e., radio-frequency signals that are reflected from DUT 100 or radio-frequency signals that have passed through at least a portion of DUT 100). If desired, additional spectrum analyzers may be coupled to paths 260 and 262 via additional broad-band couplers to gather information on the phase of signals reflected from DUT 100. By analyzing signals transmitted using signal generator 204 and signals arriving at spectrum analyzer 232, the magnitude and/or phase of the complex impedance (sometimes referred to as a reflection coefficient) of the device under test may be determined.

By analyzing the transmitted and reflected signals, tester 204 and 232 may collectively be used to obtain linear measurements such as S-parameter measurements that reveal information about whether DUT 100 exhibits satisfactory radio-frequency performance. Tester 232 may, for example, obtain an S11 (complex impedance) measurement and/or an S21 (complex forward transfer coefficient) measurement. The values of S11 and S21 (phase and magnitude) may be measured at fundamental frequency $f_0$ (as an example).

In situations in which DUT 100 is fault free, S11 and S21 measurements will have values that are relatively close to baseline measurements on fault-free antenna tuning elements. In situations in which DUT 100 contains a fault that affects its electromagnetic properties, the S11 and S21 measurements will exceed normal tolerances. When test host 202 determines that the S11 and/or S21 measurements have deviated from normal S11 and S21 measurements by more than predetermined limits, test host 202 can alert an operator that DUT 100 likely contains a fault and/or other appropriate action can be taken. If desired, other linear measurements such as frequency response measurements, gain measurements, and power efficiency measurements may also be obtained to help determine whether antenna tuning element 100 satisfies design criteria.

As shown in FIG. 7, a first spectrum analyzer 232 may be coupled to path 260 via broadband radio-frequency coupler 218. Coupler 218 may be used to divert a small fraction of reflected signals for measurement using associated tester 232. In one suitable arrangement, a notch filter such as notch filter 222 (e.g., a filter used for attenuating signals at fundamental frequency $f_0$ and for passing through signals at other frequencies), multiplexing circuits 224 and 230, and band-pass filters such as band-pass filters 226 and 228 may be interposed between broadband coupler 218 and tester 232. Filter 226 may be used for selectively passing through signals at second harmonic frequency $2f_0$, whereas filter 228 may be used for selectively passing through signals at third harmonic frequency $3f_0$. If desired, additional filters may be interposed between multiplexers 224 and 230 for selectively passing through higher order harmonic terms (e.g., signals at fourth harmonic frequency $4f_0$, signals at fifth harmonic frequency $5f_0$, signals at sixth harmonic frequency $6f_0$, etc.).

Multiplexing circuits 224 and 230 may be configured to switch one of filters 226 and 228 into use at any given point in time (e.g., filter 226 may be switched into use when performing second harmonic measurements, whereas filter 228 may be switched into use when performing third harmonic measurements). Spurious signals at the harmonic frequencies (i.e., frequencies that are integer multiples of fundamental frequency $f_0$) may be generated due to non-idealities in antenna tuning element 100. In another suitable arrangement, notch filter 222 need not be used, and tester 232 may be used to gather radio-frequency measurements at fundamental frequency $f_0$ for purposes of comparing radio-frequency metrics measured at the harmonic frequencies with test data gathered at $f_0$.

A second spectrum analyzer 232 may be coupled to path 262 via broadband radio-frequency coupler 220. Notch filter 222, multiplexing circuits 224 and 230, and band-pass filters 226 and 228 may be similarly interposed between coupler 220 and the second spectrum analyzer 232. If desired, notch filter 222 need not be used, and the second spectrum analyzer 232 may be used to gather radio-frequency measurements at fundamental frequency $f_0$. The first spectrum analyzer that is coupled to path 260 may be used to measure signals reflected/emanated from terminal A of DUT 100 while second spectrum analyzer that is coupled to path 262 may be used to measure signals reflected/emanated from terminal B of DUT 10.

The test setup (or test station) 200 as shown in FIG. 7 may therefore be used to characterize the linear performance of DUT 100 (e.g., by performing S-parameter measurements) and the non-linear performance of DUT 100 (e.g., by measuring the signal level at harmonic frequencies $2f_0$, $3f_0$, $4f_0$, etc.). The example of FIG. 7 in which triplexers are used for supporting characterization of up to two harmonic frequencies in addition to fundamental frequency $f_0$ is merely illustrative and does not serve to limit the scope of the present invention. If desired, test system 200 may be implemented using an N-plexer for multiplexing among any desired number of frequencies and using any number of band-pass filters interposed between multiplexing circuits 224 and 230 to selectively pass through desired harmonic frequencies of interest. An N-plexer may therefore sometimes be referred to as a radio-frequency multiplexing circuit.

In general, testers 204 and 232 may be used to characterize the linear and non-linear behavior of antenna tuning element 100 while test host 202 varies the impedance loading, power supply level, and operating temperature by respectively controlling the load pull tuners, power supply voltage Vdd, and temperature control unit 207 to emulate different application environments similar to ones that antenna tuning element 100 would experience if placed in an assembled device 10 during normal user operation. If desired, test host 202 may also adjust DUT 100 during characterization procedures (by adjusting Vc) to gather test data in a wide range of operating conditions.

Figure 8:
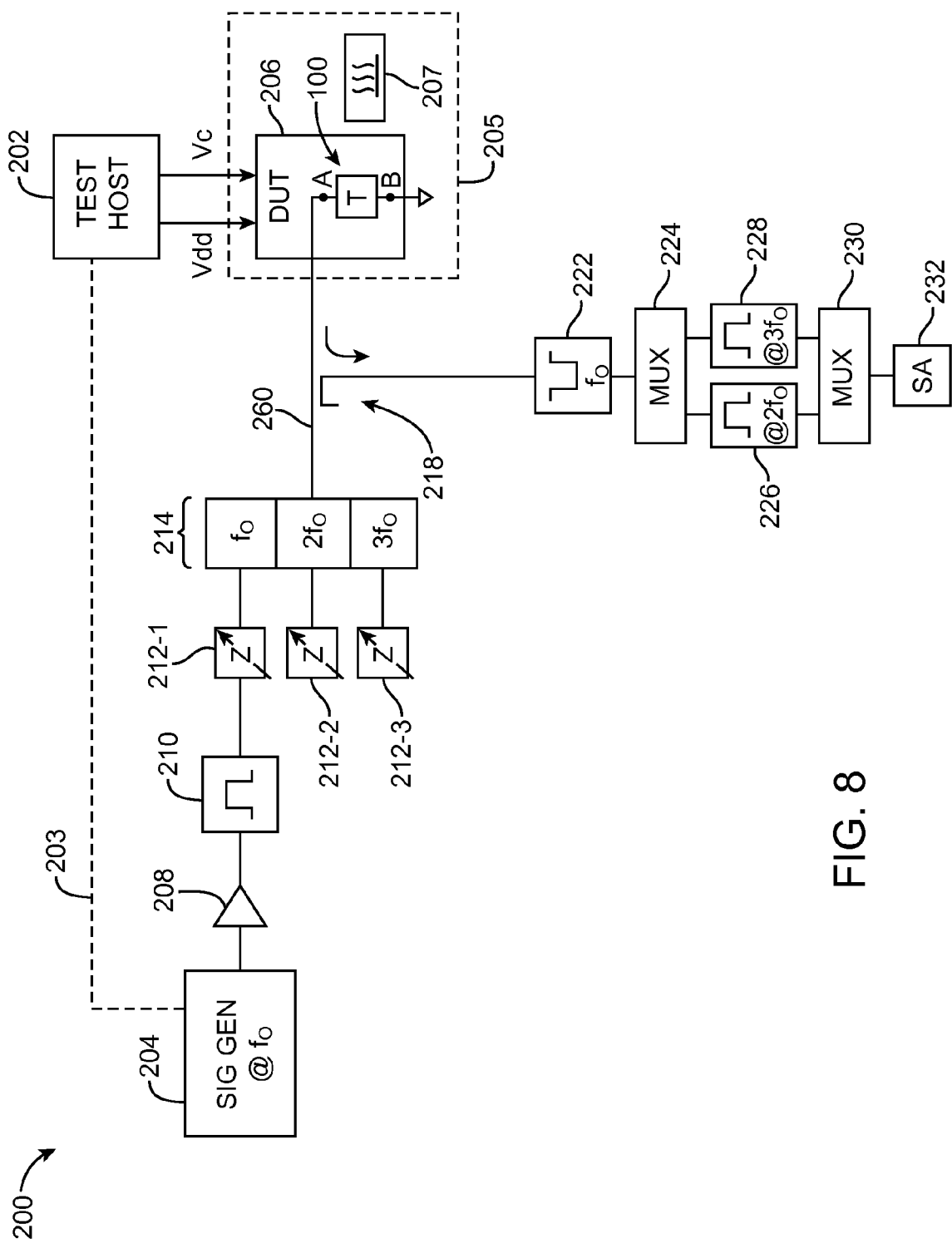
FIG. 8 is a diagram of a test system for characterizing harmonic distortion for an antenna tuning element arranged in a shunt configuration in accordance with an embodiment of the present invention.

In another suitable embodiment of the present invention, DUT 100 may be tested in a shunt configuration (see, e.g., FIG. 8). As shown in FIG. 8, DUT 100 may be placed in a test fixture 206 that couples terminal A to test equipment while shorting terminal B to ground. As with the test system of FIG. 7, test system 200 of FIG. 8 may include at least test host 202, signal generator 204, and spectrum analyzer 232. Terminal A of DUT 100 may be coupled to path 260. While test system 200 of FIG. 7 provides at least two measurement access points (see, FIG. 7, path 260 that is coupled to non-shorted terminal A and path 262 that is coupled to non-shorted terminal B), test system 200 of FIG. 7 has one measurement access point since terminal B is shorted to ground.

Test signals generated using signal generator 204 may be fed to DUT 100 via power amplifier 208, band-pass filter 210, load pull tuner 212-1, triplexer 214, and path 260, whereas a portion of reflected signals may be diverted to spectrum analyzer 232 via broadband RF coupler 218. Linear measurements such as S-parameter measurements, non-linear measurements such as power level measurements at the harmonic frequencies, and any other desired radio-frequency measurements may be obtained from DUT 100 that is placed in the shunt configuration while test host 202 varies the operating conditions (e.g., while test host 202 adjusts the load pull tuners 212 to provide load impedances other than 50 ohms, while test host 202 adjusts Vdd, Vc, and temperature control unit 207, etc.). If desired, an N-plexer may be used in place of triplexer 214 for supporting impedance adjustments of up to any number of harmonic frequencies.

In another suitable embodiment of the present invention, test system 200 may be used to characterize the amount of intermodulation distortion associated with DUT 100. Ideally, an antenna tuning element 100 such as a variable capacitor, a radio-frequency switch, or other adjustable load component is perfectly linear. In practice, however, antenna tuning elements exhibit nonlinearities, which can create undesired spurious emissions at sideband frequencies that are relatively close to fundamental operating frequencies. This phenomenon in which spurious signals are generated at frequencies other than at harmonic frequencies is sometimes referred to as intermodulation distortion. Sideband signals generated as such contribute to adjacent channel leakage, which can result in adjacent channel interference, a reduction in dynamic range, increased spectrum usage, and other unwanted effects for the antenna performance of device 10.

Figure 9:
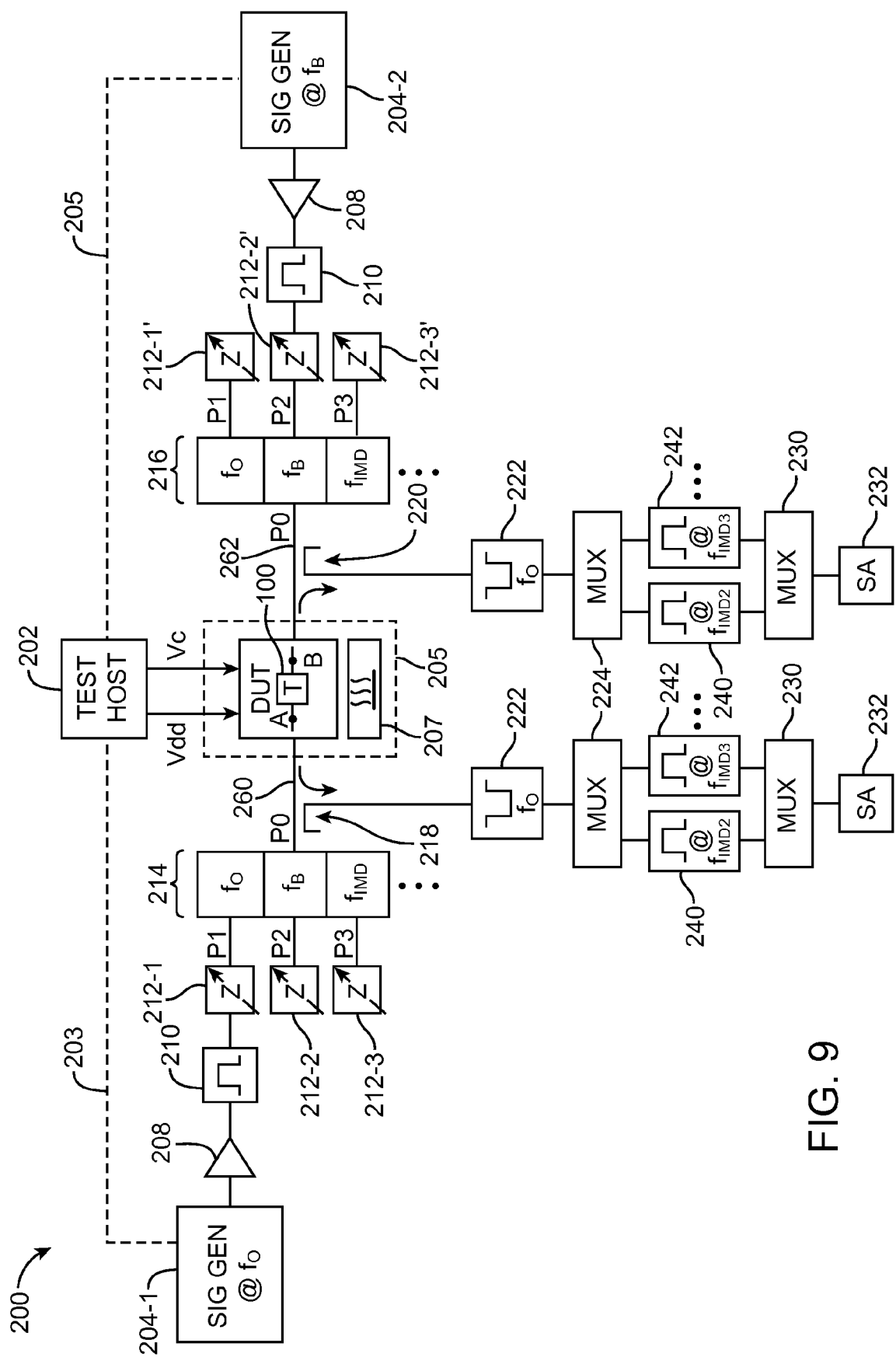
FIG. 9 is a diagram of a test system for characterizing intermodulation distortion for an antenna tuning element arranged in a series configuration in accordance with an embodiment of the present invention.

FIG. 9 is a diagram of test system 200 for characterizing intermodulation distortion for antenna tuning element 100 coupled in the series arrangement. As shown in FIG. 9, test system 200 includes at least two separate signal generators 204-1 and 204-2, because intermodulation distortion terms are only generated in the presence of two transmitted signals at different frequencies. First signal generator 204-1 may be operable to generate test signals at fundamental frequency $f_0$ and may be coupled to terminal A of DUT 100 via path 260, whereas second signal generator 204-2 may be operable to generate test signals at another frequency sometimes referred to as a "blocker" frequency $f_B$ and may be coupled to terminal B of DUT 100 via path 262.

Radio-frequency test signals generated using signal generator 204-1 may be amplified using first power amplifier 208. The amplified test signals may then be fed through a first band-pass filter 210 for suppressing signals transmitted at frequencies other than fundamental frequency $f_0$. Filter 210 may be coupled to path 260 via load pull tuner 212-1 and triplexer 214. In particular, triplexer 214 includes port P0 that is coupled to path 260, port P1 that is coupled to load pull tuner 212-1, port P2 that is coupled to load pull tuner 212-2, and port P3 that is coupled to load pull tuner 212-3. As shown in FIG. 9, signals at fundamental frequency $f_0$ may be routed through P1, signals at blocker frequency $f_B$ may be routed through P2, and signals at intermodulation frequency $f_{IMD}$ may be routed through P3. Load pull tuners 212-1, 212-2, and 212-3 may therefore serve as impedance tuners for signals (associated with terminal A) being transmitted in $f_0$, $f_B$, and $f_{IMD}$, respectively. Intermodulation frequency $f_{IMD}$ may be equal to the magnitude of $(f_0 \pm f_B)$ when measuring $2^{nd}$ order intermodulation distortion products (sometimes referred to as IMD2), may be equal to the magnitude of $(2f_0 \pm f_B)$ or $(2f_B \pm f_0)$ when measuring $3^{rd}$ order intermodulation distortion products (sometimes referred to as IMD3), or may be equal to the magnitude of $(n^*f_0 \pm m^*f_B)$, where n and m represent positive integers, for measuring higher order intermodulation distortion products.

Radio-frequency test signals generated using signal generator 204-2 may be amplified using second power amplifier 208. The amplified test signals may then be fed through a second band-pass filter 210 for suppressing signals outside of blocker frequency $f_B$. Filter 210 may be coupled to path 262 via load pull tuner 212-2' and triplexer 216. In particular, triplexer 216 may include port P0 that is coupled to path 262, port P1 that is coupled to load pull tuner 212-1', port P2 that is coupled to load pull tuner 212-2', and port P3 that is coupled to load pull tuner 212-3'. As shown in FIG. 9, signals at fundamental frequency $f_0$ may be routed through P1, signals at blocker frequency $f_B$ may be routed through P2, and signals at intermodulation frequency $f_{IMD}$ may be routed through P3. Load pull tuners 212-1', 212-2', and 212-3' may therefore serve as impedance tuners for signals (associated with terminal B) transmitted in $f_0$, $f_B$, and $f_{IMD}$, respectively.

A first spectrum analyzer 232 may be coupled to path 260 via broadband radio-frequency coupler 218. A notch filter such as notch filter 222 (e.g., a filter used for attenuating signals at fundamental frequency $f_0$ and for passing through signals at other frequencies), multiplexing circuits 224 and 230, and band-pass filters such as band-pass filters 240 and 242 may be interposed between broadband coupler 218 and tester 232. Filter 240 may be used for selectively passing through signals at the $2^{nd}$ order intermodulation frequency $f_{IMD2}$ (where $f_{IMD2}$ is equal to the magnitude of $(f_0 \pm f_B)$), whereas filter 242 may be used for selectively passing through signals at the third order intermodulation frequency $f_{IMD3}$ (where $f_{IMD3}$ is equal to the magnitude of $(2f_0 \pm f_B)$ or the magnitude of $(2f_B \pm f_0)$). If desired, additional filters may be interposed between multiplexers 224 and 230 for selectively passing through higher order intermodulation distortion terms (e.g., $4^{th}$ order intermodulation products, $5^{th}$ order intermodulation products, $6^{th}$ order intermodulation products, etc.).

Multiplexing circuits 224 and 230 may be configured to switch one of filters 240 and 242 into use during characterization operations (e.g., filter 240 may be switched into use when performing $2^{nd}$ order intermodulation distortion measurements, whereas filter 242 may be switched into use when performing $3^{rd}$ order intermodulation distortion measurements). In another suitable arrangement, notch filter 222 need not be used, and tester 232 may be used to gather radio-frequency measurements at fundamental frequency $f_0$. If desired, a second spectrum analyzer 232 may similarly be coupled to path 262 via broadband radio-frequency coupler 220, notch filter 222, multiplexing circuits 224 and 230, and band-pass filters 240 and 242 may be similarly interposed between coupler 220 and the second spectrum analyzer 232. If desired, notch filter 222 need not be used, and the second spectrum analyzer 232 may be used to gather radio-frequency measurements at fundamental frequency $f_0$. The first spectrum analyzer that is coupled to path 260 may be used to measure signals reflected/emanated from terminal A of DUT 100 while the second spectrum analyzer that is coupled to path 262 may be used to measure signals reflected/emanated from terminal B of DUT 100.

The test setup 200 as shown in FIG. 9 that includes multiple signal generators and at least one spectrum analyzer may be used to characterize the linear performance of DUT 100 (e.g., by performing S-parameter measurements) and the non-linear performance of DUT 100 (e.g., by measuring the signal levels at intermodulation frequencies $f_{IMD2}$, $f_{IMD3}$, $f_{IMD4}$, etc.). The example of FIG. 9 in which triplexers are used for supporting characterization of up to two intermodulation distortion terms is merely illustrative and does not serve to limit the scope of the present invention. If desired, test system 200 may be implemented using an N-plexer for multiplexing among any desired number of frequencies and using any number of band-pass filters interposed between multiplexing circuits 224 and 230 to selectively pass through desired intermodulation product terms of interest. In general, testers 204 and 232 may be used to characterize the linear and non-linear behavior of antenna tuning element 100 while test host 202 varies the impedance loading, power supply level, and operating temperature by respectively controlling the load pull tuners, power supply voltage Vdd, and temperature control unit 207 to emulate different application environments similar to ones that antenna tuning element 100 would experience if placed in an assembled device 10 during normal user operation. If desired, test host 202 may also adjust DUT 100 during characterization procedures (by adjusting Vc) to gather test data in a wide range of operating modes.

Figure 10:
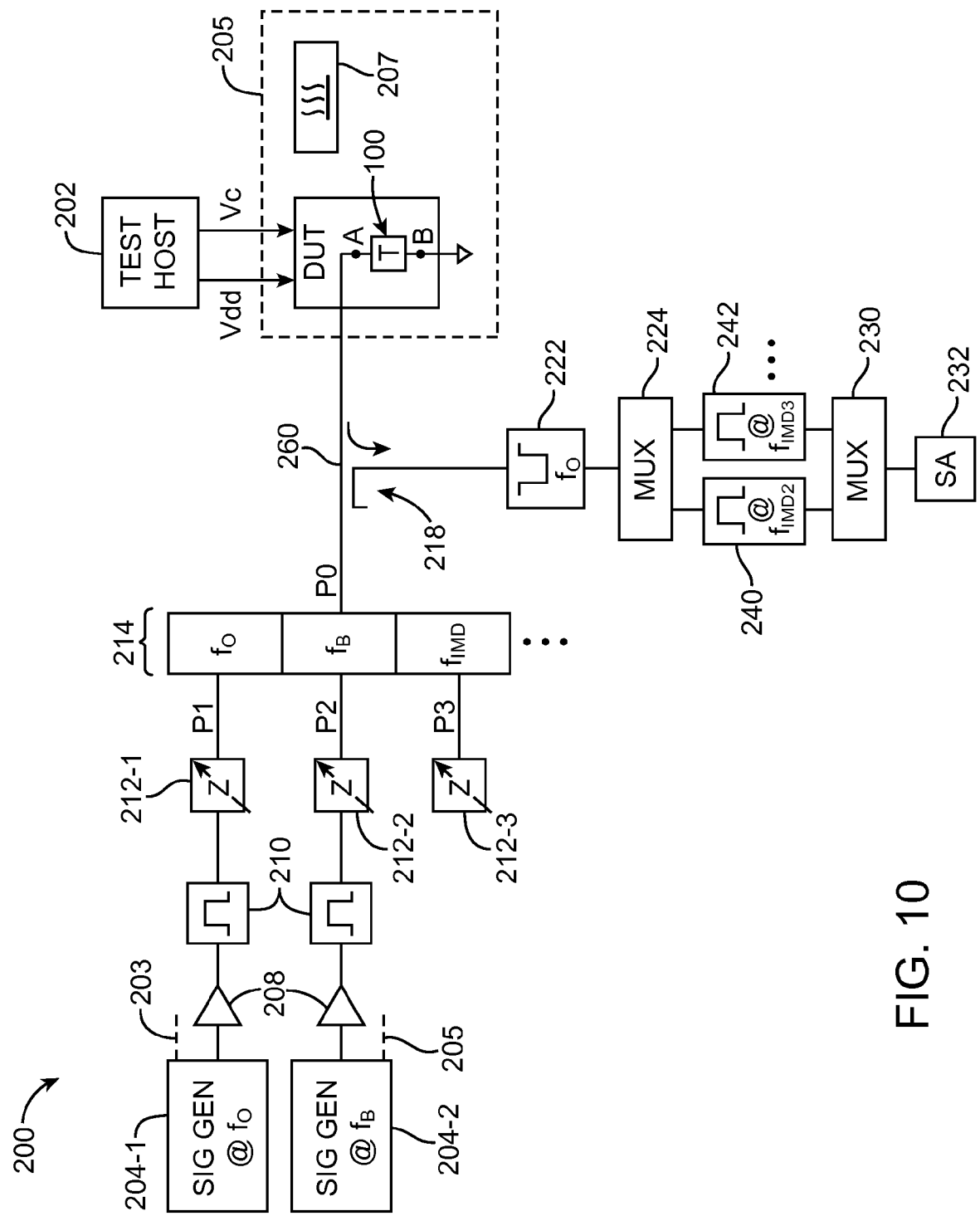
FIG. 10 is a diagram of a test system for characterizing intermodulation distortion for an antenna tuning element arranged in a shunt configuration in accordance with an embodiment of the present invention.

In another suitable embodiment of the present invention, intermodulation distortion measurements may be taken while DUT 100 is placed in a shunt configuration (see, e.g., FIG. 10). As shown in FIG. 10, DUT 100 may be placed in a test fixture 206 that couples terminal A to test equipment while shorting terminal B to ground. Test system 200 of FIG. 10 may include test host 202, at least two signal generators 204-1 and 204-2, and spectrum analyzer 232. Terminal A of DUT 100 may be coupled to path 260. While test system 200 of FIG. 9 provides at least two measurement access points (see, FIG. 9, path 260 that is coupled to non-shorted terminal A and path 262 that is coupled to non-shorted terminal B), test system 200 of FIG. 10 has one measurement access point since terminal B is shorted to ground.

Test signals generated using signal generator 204-1 may be fed to DUT 100 via first power amplifier 208, first band-pass filter 210, load pull tuner 212-1, port P1 in triplexer 214, and path 260. Test signals generated using signal generator 204-2 may be fed to DUT 100 via second power amplifier 208, second band-pass filter 210, load pull tuner 212-2, port P2 in triplexer 214, and path 260. Triplexer 214 may have port P3 that is coupled to load pull tuner 212-3 and port P0 that is coupled to path 260. Triplexer 214 arranged in this configuration may serve to route signals at $f_0$ from first signal generator 204-1 to DUT 100 and to route signals at $f_B$ from second signal generator 204-2 to DUT 100. Load pull tuners 212-1, 212-2, and 212-3 may be used to vary the impedance experienced by radio-frequency signals transmitted at $f_0$, $f_B$, and $f_{IMD}$, respectively. A portion of signals that is conveyed on path 260 from terminal A of DUT 100 towards port P0 of triplexer 212 may be diverted to spectrum analyzer 232 via broadband RF coupler 218. Linear measurements such as S-parameter measurements, non-linear measurements such as power level measurements at the intermodulation frequencies, and any other desired radio-frequency measurements may be obtained from DUT 100 placed in the shunt configuration while test host 202 varies the operating conditions (e.g., while test host 202 adjusts the load pull tuners 212 to present loading impedances other than 50 ohms, while test host 202 adjusts Vdd, Vc, and temperature control unit 207, etc.). If desired, an N-plexer may be used in place of triplexer 214 for supporting impedance adjustments of up to any number of higher order intermodulation frequencies.

Figure 11:
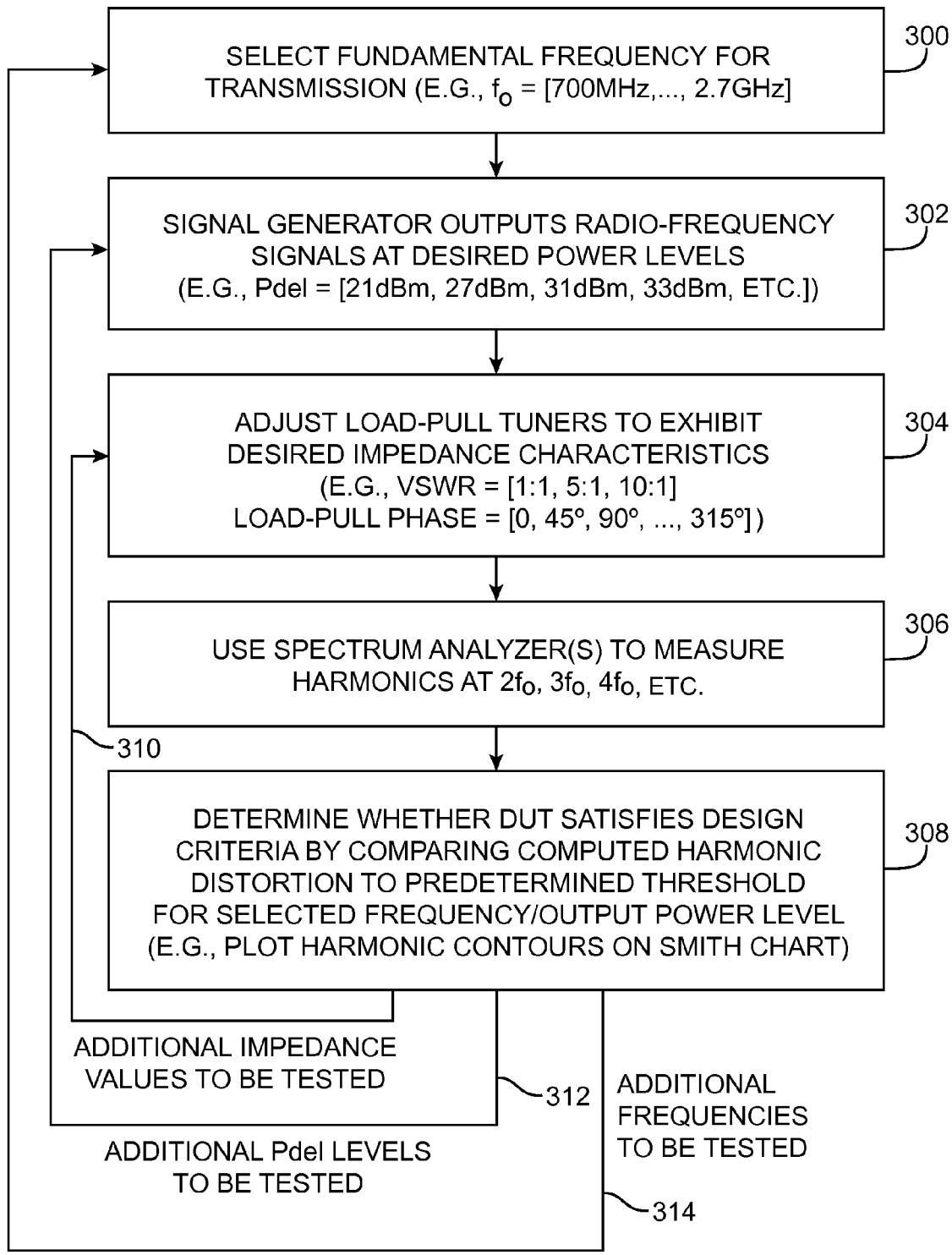
FIG. 11 is a flow chart of illustrative steps for characterizing harmonic distortion using the test system of FIG. 7 or FIG. 8 in accordance with an embodiment of the present invention.

FIG. 11 is a flow chart of illustrative steps for characterizing harmonic distortion using test system 200 of the type described in connection with FIGS. 7 and 8. At step 300, test host 202 may select a desired fundamental frequency for transmission (e.g., signal generator 204 may be configured to output radio-frequency signals at a selected fundamental frequency $f_0$ of 700 MHz, as an example). At step 302, test host 202 may direct signal generator 204 to output radio-frequency test signals at a suitable output power level such that signals arriving at DUT 100 will exhibit the desired delivered power level Pdel. As an example, test signals arriving at DUT 100 may be delivered at 21 dBm of power during one test iteration.

At step 304, test host 202 may direct the different load pull tuners such that desired impedance characteristics are presented to DUT 100. As an example, the various load pull tuners 212 coupled to terminal A (e.g., load pull tuners 212-1, 212-2, 212-3, etc.) may be adjusted such that radio-frequency signals on path 260 exhibit a voltage standing wave ratio (VSWR) of 5:1 and a load pull phase of 45°. The various load pull tuners 212' coupled to terminal B (e.g., load pull tuners 212-1', 212-2', 212-3', etc.) may be adjusted such that radio-frequency signals on path 262 exhibit a voltage standing wave ratio (VSWR) of 10:1 and a load pull phase of 90°. As another example, the load pull tuners 212 and 212' coupled to terminals A and B, respectively, may be adjusted such that RF signals on paths 260 and 262 exhibit a VSWR of 1:1 and a load pull phase of zero degrees. Power level Pmeas measured in association with a VSWR of 1:1 may be used as a benchmark metric for comparing with power levels measured at impedances that yield VSWRs that are greater than one. As another example, the load pull tuners 212 and 212' may be adjusted such that RF signals on paths 260 and 262 exhibit a VSWR of 10:1 and a load pull phase of 90 degrees. In general, the VSWR and load-pull phase at the two terminals of DUT 100 may be the same or may be mismatched (assuming DUT 100 is being tested in the series configuration).

Voltage standing wave ratio may be defined as the voltage ratio of the maximum standing wave amplitude to the minimum standing wave amplitude and may be used as an efficiency measurement for radio-frequency transmission lines (e.g., a metric for quantifying the amount of signals being reflected back toward the source due to impedance mismatch at the terminals of the transmission line). An ideal transmission line with no reflected power would have a VSWR of 1:1, whereas a transmission line that sees all of the transmitted signals being reflected would exhibit an infinite VSWR. The load pull phase refers to the effective phase shift of the standing waveform as a result of the reflected signals.

At step 306, spectrum analyzer(s) 232 may be used to measure the harmonic distortion signals at harmonic frequencies $2f_0$, $3f_0$, $4f_0$, ..., up to at least $11f_0$, etc. At step 308, test host 202 may first compute harmonic distortion values based on the test data gathered during step 306. Test host 202 may then be used to determine whether DUT 100 satisfies design criteria by comparing the computed harmonic distortion values to a predetermined threshold for the currently selected frequency and delivered power Pdel (e.g., harmonic contours may be plotted on a Smith chart to determine whether DUT 100 exhibits satisfactory contour curves).

Processing may loop back to step 304 if there are additional impedance values to be tested (as indicated by path 310). Processing may loop back to step 302 if there are additional power levels to be tested, as indicated by path 312 (e.g., Pdel may be set to 27 dBm, 31 dBm, 33 dBm, etc.). Processing may loop back to step 300 if there are additional frequencies to be tested, as indicted by path 314 (e.g., fundamental frequency f0 may be set to 800 MHz, 900 MHz, 1 GHz, 1.1 GHz, . . . , 2.6 GHz, 2.7 GHz). The steps of FIG. 11 for characterizing the harmonic distortion for DUT 100 in the series/shunt configuration is merely illustrative and does not serve to limit the scope of the present invention. If desired, DUT 100 may be characterized at any suitable frequency band, power level Pdel, impedance, and temperature.

Figure 12:
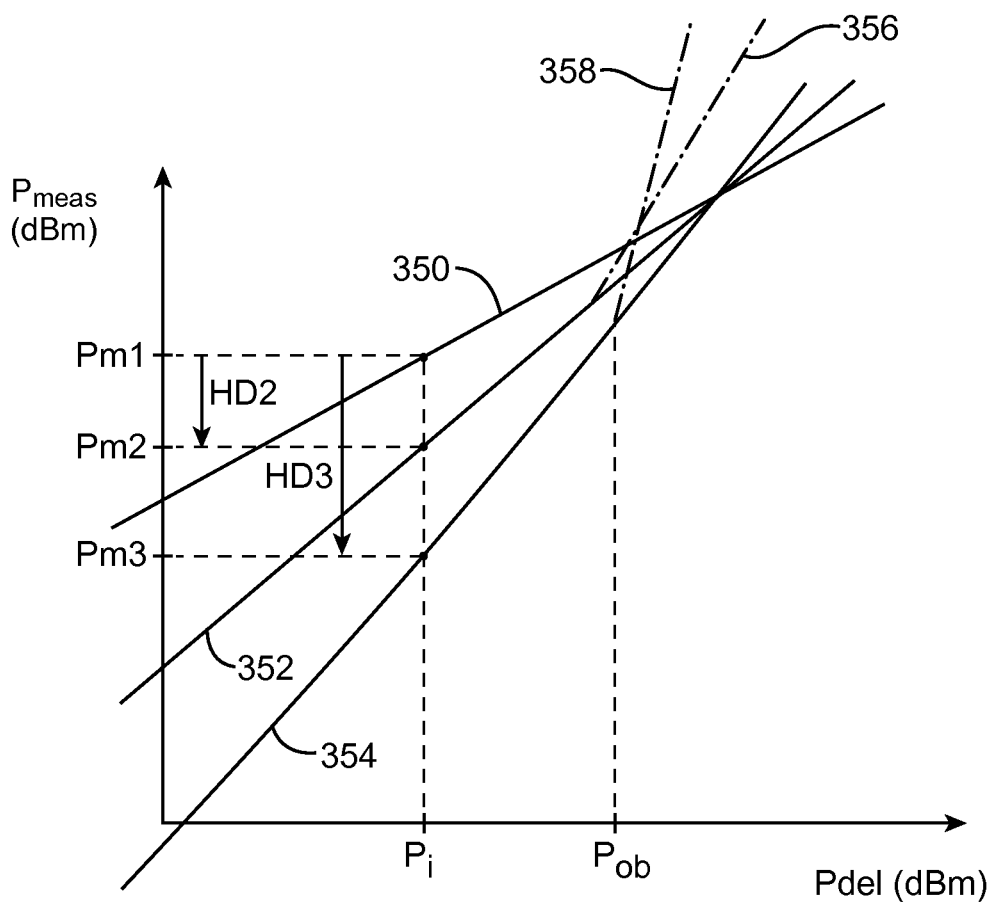
FIG. 12 is a plot showing measured power level versus input power level illustrating harmonic distortion in accordance with an embodiment of the present invention.

FIG. 12 is a plot showing measured power level Pmeas versus input power level (i.e., power Pdel delivered to DUT 100) illustrating harmonic distortion measurements on a log scale (in units of dBm) for a given fundamental frequency. As shown in FIG. 12, line 350 plots the measured signal level at fundamental frequency $f_0$, line 352 plots the measured signal level at second harmonic frequency $2f_0$, and line 354 plots the measured signal level at third harmonic frequency $3f_0$. Generally, for a given input power Pdel, the output power level measured at $2f_0$ is less than the output power level measured at $f_0$. Similarly, the output power level measured at $3f_0$ is less than the output power level measured at $2f_0$ at the given input power level Pdel. However, in certain scenarios, the output power level measured at $3f_0$ can be higher than the output power level measured at $2f_0$ at the given input power level Pdel.

As illustrated in FIG. 12, a $2^{nd}$ harmonic distortion value HD2 may be defined as the ratio of the measured output power level at $2f_0$ corresponding to a given input power Pi to the measured output power level at $f_0$ corresponding to input power level Pi. A $3^{rd}$ harmonic distortion value HD3 may be defined as the ratio of the measured output power level at $3f_0$ corresponding to given input power Pi to the measured output power level at $f_0$ corresponding to power level Pi. In general, an $n^{th}$ harmonic distortion value HDn is defined as the ratio of output power level measured at the $n^{th}$ harmonic frequency $n*f_0$ to the output power level measured at the fundamental frequency $f_0$. Harmonic distortion values may be represented in units of dBc. Test host 202 may be used to compute these different order harmonic distortion values for each desired input power Pdel.

Harmonic distortion values also tend to decrease as input power Pdel is lowered. At a certain input power level, DUT 100 may experience reliability issues such as oxide breakdown or soft breakdown (e.g., a condition in which a semiconductor device in DUT 100 can no longer be controlled in a predictable manner). In the example of FIG. 12, curves 352 and 354 may rise dramatically when Pdel is raised beyond oxide break threshold power level Pob (as indicated by dotted lines 356 and 358, respectively). Oxide break threshold power level Pob may vary as a function of frequency, temperature, impedance, and other factors that impact the operation of DUT 100.

Figure 13:
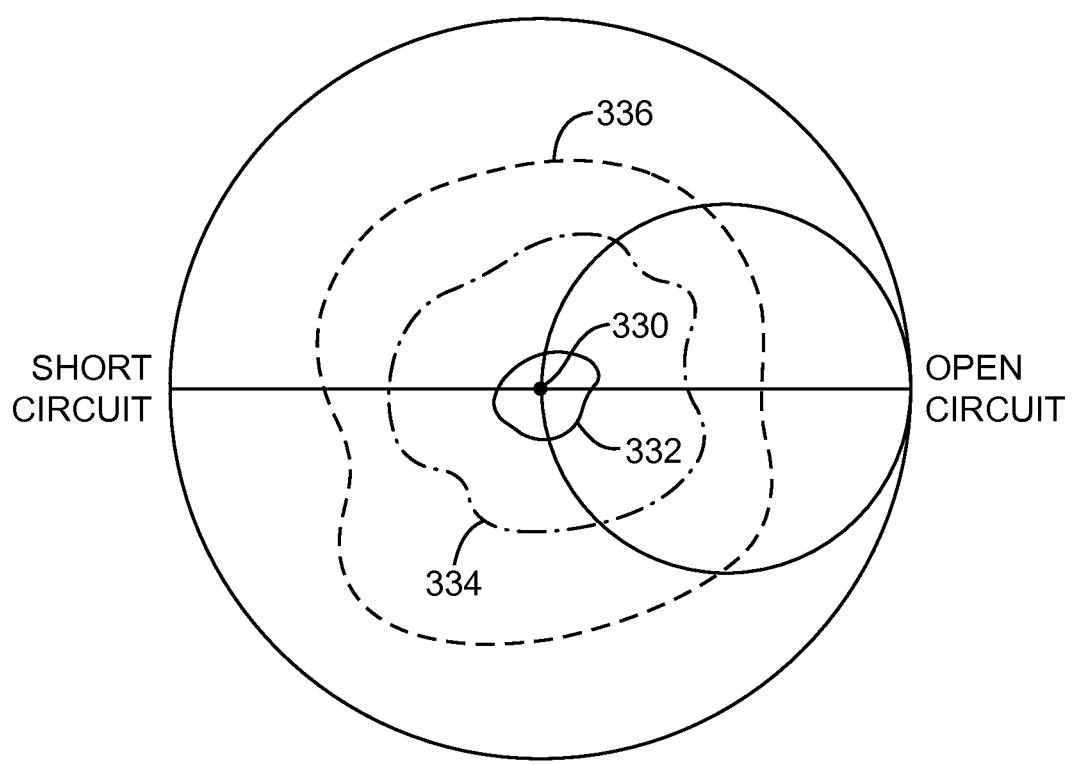
FIG. 13 is a Smith chart illustrating harmonic distortion contour profiles associated with a given operating frequency and input power level in accordance with an embodiment of the present invention.

The harmonic distortion values computed at step 308 (FIG. 11) may be plotted on a Smith chart (see, e.g., FIG. 13). FIG. 13 shows a Smith chart in which complex impedance has been plotted as a function of varying levels of $2^{nd}$ order harmonic distortion HD2. For example, contour curve 332 may represent the complex impedance values for which HD2 is equal to −60 dBc, contour curve 334 may represent the complex impedance values for which HD2 is equal to −50 dBc, and contour curve 336 may represent the complex impedance values for HD2 is equal to −40 dBc. Point 330 on the Smith chart indicates the position of an ideal 50 ohm impedance for optimal power transfer. Contour curves that are closer to point 330 may therefore exhibit less harmonic distortion since there are less reflected signals when the impedance is relatively close to point 330, whereas contour curves that are further away from point 330 may exhibit greater harmonic distortion due to the presence of more signals being reflected back toward the source. These contour curves (e.g., contours 332, 334, and 336) may be compared to predetermined threshold contour profiles to determine whether DUT 100 exhibits acceptable levels of harmonic distortion.

In the exemplary diagram of FIG. 13, the contours are associated with HD2 values corresponding to a fundamental frequency of 900 MHz and at a delivered power Pdel of 35 dBm. If desired, HD2 contour curves may be plotted at any desired frequency, at any desired input power level, at any suitable temperature, etc. Third order harmonic distortion values (or higher order harmonic distortion products) can also be plotted in this way to determine whether DUT 100 satisfies design criteria. If desired, impedance contour curves may also be plotted as a function of varying levels of soft oxide breakdown power level.

Figure 14:
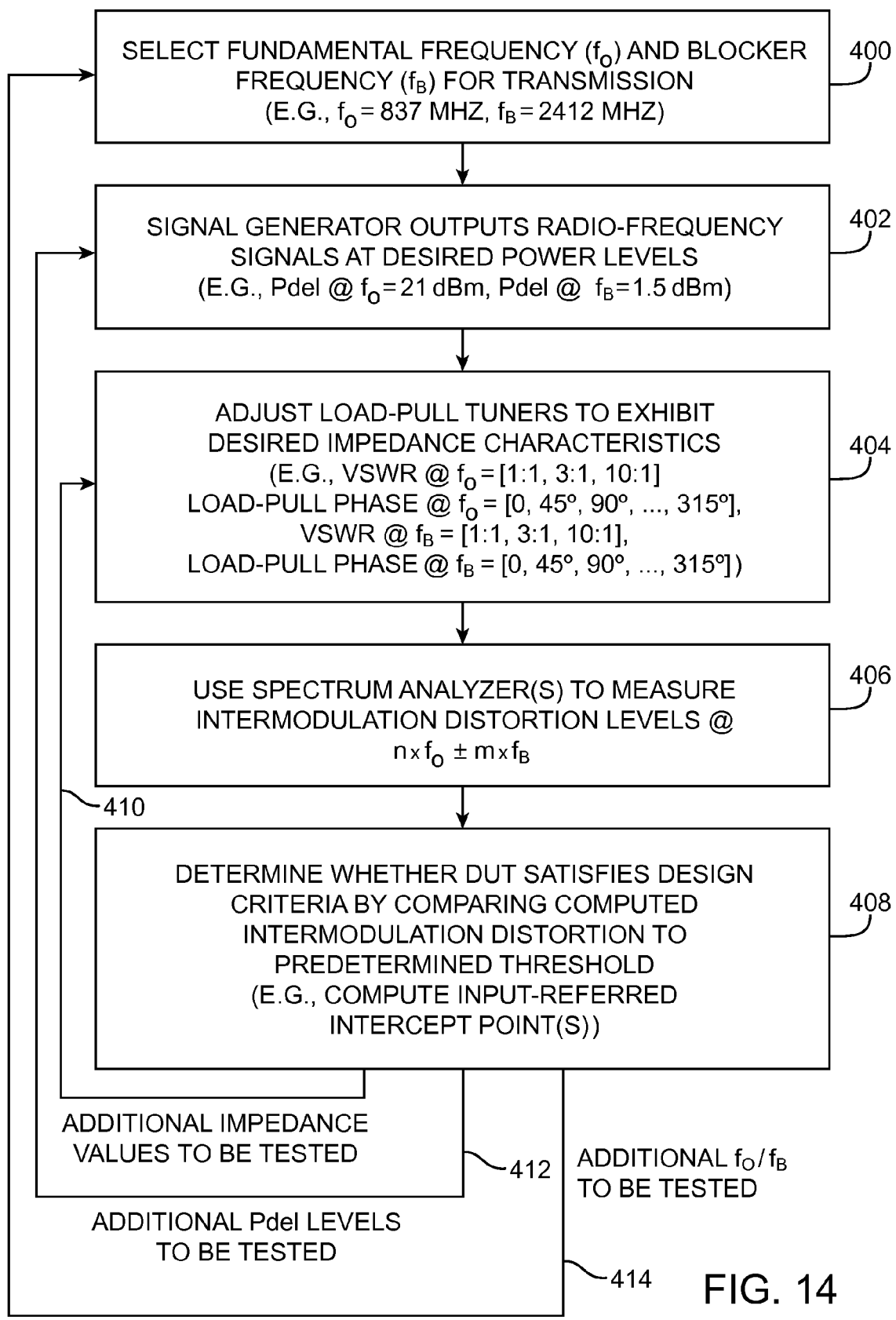
FIG. 14 is a flow chart of illustrative steps for characterizing harmonic distortion using the test system of FIG. 9 or FIG. 10 in accordance with an embodiment of the present invention.

FIG. 14 is a flow chart of illustrative steps for characterizing intermodulation distortion using test system 200 of the type described in connection with FIGS. 9 and 10. At step 400, test host 202 may configure signal generator 204-1 for radio-frequency transmission at a desired fundamental frequency $f_0$ of 837 MHz and may configure signal generator 204-2 for radio-frequency transmission at a desired blocker frequency $f_B$ of 2412 MHz (as an example). At step 402, test host 202 may direct signal generator 204-1 to output radio-frequency test signals at a suitable output power level such that signals arriving at terminal A of DUT 100 will exhibit a Pdel of 21 dBm and may direct signal generator 204-2 to output radio-frequency test signals at a suitable output power level such that signals arriving at terminal B of DUT 100 will exhibit a Pdel of 1.5 dBm (as an example). The power that is delivered to DUT 100 from terminal A may be the same or may be different than the power that is delivered to DUT 100 from terminal B.

At step 404, test host 202 may direct the different load pull tuners such that desired impedance loading is presented to DUT 100. As an example, the various load pull tuners 212 coupled to terminal A (e.g., load pull tuners 212-1, 212-2, 212-3, etc.) may be adjusted such that radio-frequency signals on path 260 exhibit a voltage standing wave ratio (VSWR) of 3:1 and a load pull phase of 315°. The various load pull tuners 212' coupled to terminal B (e.g., load pull tuners 212-1', 212-2', 212-3', etc.) may be adjusted such that radio-frequency signals on path 262 exhibit a voltage standing wave ratio (VSWR) of 10:1 and a load pull phase of 135°. As another example, the load pull tuners 212 and 212' coupled to terminals A and B, respectively, may be adjusted such that RF signals on paths 260 and 262 exhibit a VSWR of 3:1 and a load pull phase of 45°. Power level Pmeas measured in association with a VSWR of 1:1 may be used as a benchmark metric for comparing with power levels measured at impedances that yield VSWRs that are greater than one. In general, the VSWR and load-pull phase at the two terminals of DUT 100 may be the same or may be mismatched (assuming DUT 100 is being tested in the series configuration).

At step 406, spectrum analyzer(s) 232 may be used to measure the intermodulation distortion signals at intermodulation frequencies $f_{IMD2}$, $f_{IMD3}$, $f_{IMD4}$, etc (e.g., at different possible combinations of ($nf_0 \pm mf_B$), where n and m are positive integers). At step 408, test host 202 may first compute intermodulation distortion values based on the test data gathered during step 406. Test host 202 may then be used to determine whether DUT 100 satisfies design criteria by comparing the computed intermodulation distortion values to a predetermined threshold for the currently selected frequencies $f_0$ and $f_B$ and delivered power levels Pdel (e.g., test host 202 may be used to compute input-referred intercept points).

Processing may loop back to step 404 if there are additional impedance values to be tested (as indicated by path 410). Processing may loop back to step 402 if there are additional power levels to be tested, as indicated by path 412 (e.g., Pdel at $f_0$ and Pdel at $f_B$ may be set to any desired output power levels). Processing may loop back to step 400 if there are additional frequencies to be tested, as indicted by path 414. The steps of FIG. 14 for characterizing the intermodulation distortion for DUT 100 in the series/shunt configuration is merely illustrative and does not serve to limit the scope of the present invention. If desired, DUT 100 may be characterized at any suitable frequency band, power level Pdel, impedance, and temperature using any number of signal generators 204 and testers 232.

Figure 15:
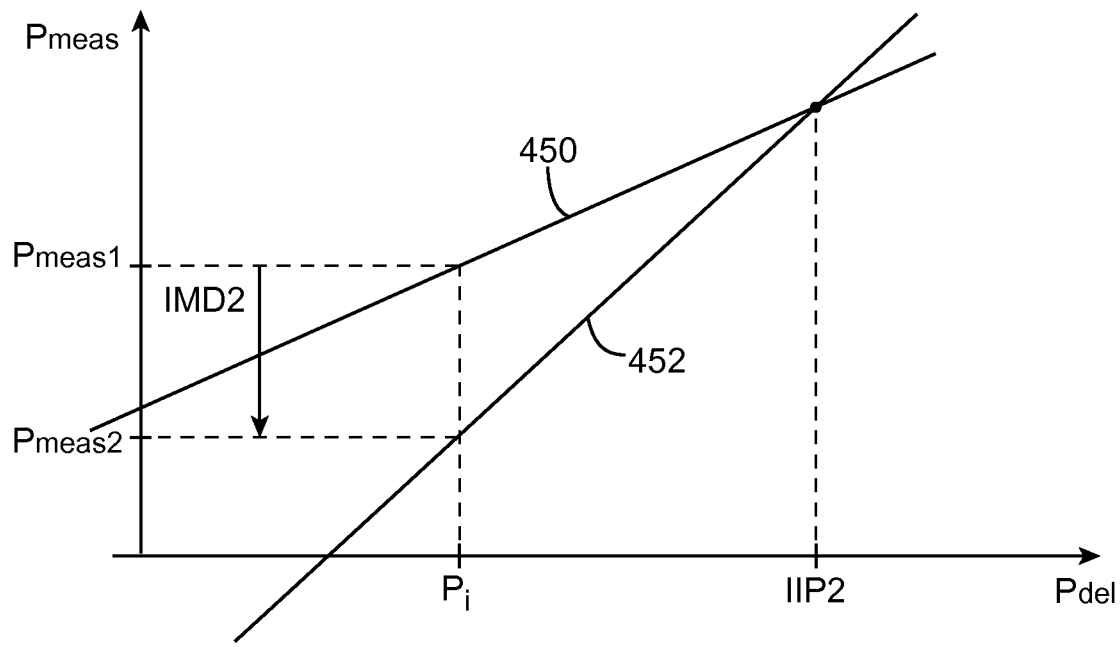
FIGS. 15 and 16 are plots showing measured power level versus input power level illustrating intermodulation distortion in accordance with an embodiment of the present invention.

FIG. 15 is a plot showing measured power level Pmeas versus input power level (i.e., power Pdel delivered to DUT 100) illustrating $2^{nd}$ order intermodulation distortion measurements on a log scale (in units of dBm) for a given fundamental frequency. As shown in FIG. 15, line 450 plots the measured signal level at fundamental frequency $f_0$, whereas line 452 plots the measured signal level at a second order intermodulation frequency $f_{IMD2}$. Generally, for a given input power Pdel, the output power level measured at $f_{IMD2}$ is less than the output power level measured at $f_0$.

As illustrated in FIG. 15, a $2^{nd}$ order intermodulation distortion value IMD2 may be defined as the ratio of the measured output power level at $f_{IMD2}$ corresponding to a given input power Pi to the measured output power level at $f_0$ corresponding to input power level Pi. As with other power ratio metrics, intermodulation distortion values may be represented in units of dBc. Test host 202 may be used to compute these different order intermodulation distortion values for each desired input power Pdel.

Intermodulation distortion values also tend to decrease as input power Pdel is lowered. At a certain input power level, the power level of spurious signals at the intermodulation frequencies may be equal in magnitude to the power level of traffic signals at $f_0$ (e.g., at a certain level of Pdel, lines 450 and 452 may intersect). This point of intersection at which lines 450 and 452 meet may corresponding to a critical input power level sometimes referred to as a $2^{nd}$ order intermodulation distortion input-referred intercept point IIP2. Intercept point IIP2 may be obtained by linearly extrapolating the lines 450 and 452 (as an example). The computed IIP2 level may be compared to a predetermined threshold IIP2' to determine whether DUT 100 satisfies design criteria.

Figure 16:
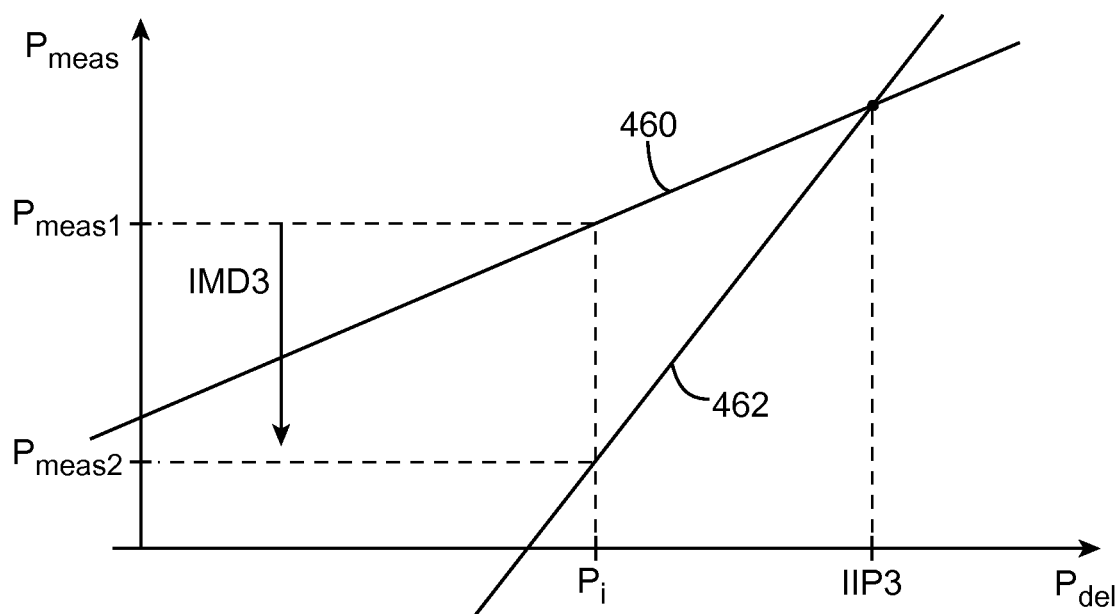

FIG. 16 is a plot showing measured power level Pmeas versus input power level (i.e., power Pdel delivered to DUT 100) illustrating $3^{rd}$ order intermodulation distortion measurements on a log scale (in units of dBm) for a given fundamental frequency. As shown in FIG. 16, line 460 plots the measured signal level at fundamental frequency $f_0$, whereas line 462 plots the measured signal level at a third order intermodulation frequency $f_{IMD3}$. Generally, for a given input power Pdel, the output power level measured at $f_{IMD3}$ is less than the output power level measured at $f_0$.

As illustrated in FIG. 16, a $3^{rd}$ order intermodulation distortion value IMD3 may be defined as the ratio of the measured output power level at $f_{IMD3}$ corresponding to a given input power Pi to the measured output power level at $f_0$ corresponding to input power level Pi. Test host 202 may be used to compute these different order intermodulation distortion values for each desired input power Pdel. At a certain input power level, the power level of spurious signals at the intermodulation frequencies may be equal in magnitude to the power level of traffic signals at $f_0$ (e.g., at a certain level of Pdel, lines 460 and 462 may intersect). This point of intersection at which lines 460 and 462 meet may corresponding to a critical input power level sometimes referred to as a $3^{rd}$ order intermodulation distortion input-referred intercept point IIP3. Intercept point IIP3 may be obtained by linearly extrapolating the lines 460 and 462 (as an example). The computed IIP3 level may be compared to a predetermined threshold IIP3' to determine whether DUT 100 satisfies design criteria.

In general, an $n^{th}$ order intermodulation distortion value IMDn is defined as the ratio of output power level measured at an $n^{th}$ order intermodulation frequency to the output power level measured at the fundamental frequency $f_0$. If desired, the intermodulation distortion values computed at step 408 (FIG. 14) may be plotted on a Smith chart to determine whether DUT 100 exhibits satisfactory intermodulation contour curves.

The foregoing is merely illustrative of the principles of this invention and various modifications can be made by those skilled in the art without departing from the scope and spirit of the invention. The foregoing embodiments may be implemented individually or in any combination.

What is claimed is:

1. A radio-frequency test system for testing an adjustable antenna tuning element, comprising:
    a first signal generator that is configured to provide first radio-frequency signals at only a first frequency to the adjustable antenna tuning element;
    a second signal generator configured to provide second radio-frequency signals at only a second frequency that is different than the first frequency to the adjustable antenna tuning element; and
    a first load pull tuner coupled to the adjustable antenna tuning element;
    a tester that is coupled to the adjustable antenna tuning element via a broadband radio-frequency coupler, wherein the tester is configured to obtain radio-frequency signal measurements while the first and second signal generators are providing the first and second radio-frequency signals to the adjustable antenna tuning element, and wherein the radio-frequency signal measurements obtained using the tester include intermodulation distortion measurements associated with the first radio-frequency signals at the first frequency and the second radio-frequency signals at the second frequency; and
    a notch filter interposed between the tester and the broadband radio-frequency coupler, wherein the notch filter is configured to attenuate radio-frequency signals at the first frequency.

2. The radio-frequency test system defined in claim 1, wherein the adjustable antenna tuning element includes first and second terminals, wherein the first signal generator is coupled to the first terminal of the adjustable antenna tuning element, and wherein the second signal generator is coupled to the second terminal of the adjustable antenna tuning element.

3. The radio-frequency test system defined in claim 1, wherein the adjustable antenna tuning element includes first and second terminals, wherein the first and second signal generators are coupled to the first terminal of the adjustable antenna tuning element.

4. The radio-frequency test system defined in claim 1, wherein the adjustable antenna tuning element includes first and second terminals, wherein the first load pull tuner is coupled to the first terminal of the adjustable antenna tuning element, the test system further comprising:
    at least a second load pull tuner that is coupled to the second terminal of the adjustable antenna tuning element; and
    a test host configured to control the first and second load pull tuners for emulating performance of the adjustable antenna tuning element in a tunable wireless electronic device antenna.

5. The radio-frequency test system defined in claim 1, further comprising:
    first and second band-pass filters interposed between the notch filter and the tester, wherein the first band-pass filter is configured to pass through only radio-frequency signals at a second order intermodulation frequency, and wherein the second band-pass filter is configured to pass through only radio-frequency signals at a third order intermodulation frequency.

* * * * *